(12) United States Patent
Yoon et al.

(10) Patent No.: US 12,376,436 B2
(45) Date of Patent: Jul. 29, 2025

(54) DISPLAY DEVICE INCLUDING A WAVELENGTH CONTROL LAYER

(71) Applicant: Samsung Display Co., LTD., Yongin-si (KR)

(72) Inventors: Hyung Guen Yoon, Hwaseong-si (KR); Suk Hoon Kang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 359 days.

(21) Appl. No.: 17/881,148

(22) Filed: Aug. 4, 2022

(65) Prior Publication Data

US 2023/0178693 A1 Jun. 8, 2023

(30) Foreign Application Priority Data

Dec. 6, 2021 (KR) .................. 10-2021-0172776

(51) Int. Cl.
*H10H 20/851* (2025.01)
*H10H 20/831* (2025.01)
*H10H 29/14* (2025.01)

(52) U.S. Cl.
CPC .... *H10H 20/8514* (2025.01); *H10H 20/8312* (2025.01); *H10H 29/142* (2025.01)

(58) Field of Classification Search
None
See application file for complete search history.

(56) References Cited

U.S. PATENT DOCUMENTS

| 11,910,685 B2 | 2/2024 | Lee |
| 11,943,987 B2 | 3/2024 | Lee et al. |
| 11,983,350 B2 | 5/2024 | Kang et al. |
| 2012/0250320 A1* | 10/2012 | Harbers ................. F21K 9/233 362/235 |
| 2014/0367633 A1* | 12/2014 | Bibl ..................... H10H 20/851 257/13 |
| 2017/0236866 A1* | 8/2017 | Lee ........................ H10H 29/14 257/89 |
| 2020/0075814 A1* | 3/2020 | Park ....................... C09K 11/06 |
| 2020/0258946 A1* | 8/2020 | Kim ...................... H10K 50/115 |
| 2021/0050388 A1* | 2/2021 | Song .................... H10K 59/353 |
| 2021/0217739 A1* | 7/2021 | Lee ..................... H01L 25/0753 |

(Continued)

FOREIGN PATENT DOCUMENTS

KR 10-2010-0053409 5/2010
KR 10-2018-0114979 10/2018
(Continued)

*Primary Examiner* — Davienne N Monbleau
*Assistant Examiner* — Dmitri Mihaliov
(74) *Attorney, Agent, or Firm* — KILE PARK REED & HOUTTEMAN PLLC

(57) ABSTRACT

A display device includes pixels; a substrate; a first electrode and a second electrode disposed in each of the pixels and spaced apart from each other on a substrate; light-emitting elements disposed between the first electrode and the second electrode; a wavelength control layer disposed on the light-emitting elements; and a light-transmitting layer disposed between the light-emitting elements and the wavelength control layer, wherein the light-transmitting layer disposed in each of the pixels is spaced apart from the light-transmitting layer disposed in an adjacent one of the plurality of pixels.

19 Claims, 11 Drawing Sheets

(56) References Cited

U.S. PATENT DOCUMENTS

2021/0273142 A1\* 9/2021 Kang .................... G06F 1/1694
2021/0359011 A1\* 11/2021 Lee ...................... H10K 50/822

FOREIGN PATENT DOCUMENTS

| KR | 10-2019-0035491 | 4/2019 |
| KR | 10-2020-0001649 | 1/2020 |
| KR | 10-2020-0088923 | 7/2020 |
| KR | 10-2020-0145900 | 12/2020 |
| KR | 10-2021-0003993 | 1/2021 |
| KR | 10-2021-0142038 | 11/2021 |

\* cited by examiner

DISPLAY DEVICE INCLUDING A WAVELENGTH CONTROL LAYER

CROSS-REFERENCE TO RELATED APPLICATION

This application claims priority to and benefits of Korean Patent Application No. 10-2021-0172776 under 35 U.S.C. § 119, filed on Dec. 6, 2021 in the Korean Intellectual Property Office (KIPO), the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices include a display panel such as an organic light-emitting display panel and a liquid-crystal display panel for displaying images. Among them, light-emitting display panel may include light-emitting elements. For example, light-emitting diodes (LEDs) may include an organic light-emitting diode (OLED) using an organic material as a luminescent material, and an inorganic light-emitting diode using an inorganic material as a luminescent material.

SUMMARY

Embodiments of the disclosure provide a display device in which a light-transmitting layer is disposed between a wavelength control layer and light-emitting elements so that it is possible to improve a luminance uniformity of light incident on the wavelength control layer. Accordingly, the amount of light per area of the wavelength control layer is reduced, and thus it is possible to prevent damage to the wavelength control layer by a thermal energy of the light and to provide the display device with improved display quality.

It should be noted that objects of the disclosure are not limited to the above-mentioned object; and other objects of the disclosure will be apparent to those skilled in the art from the following descriptions.

According to an embodiment, a display device may comprise pixels; a first electrode and a second electrode disposed in each of the pixels and spaced apart from each other on a substrate; light-emitting elements disposed between the first electrode and the second electrode; a wavelength control layer disposed above the light-emitting elements; and a light-transmitting layer disposed between the light-emitting elements and the wavelength control layer, wherein the light-transmitting layer disposed in each of the pixels may be spaced apart from the light-transmitting layer disposed in an adjacent one of the pixels.

The display device may further comprise a bank disposed along a boundary of each of the pixels on the substrate, wherein the bank may expose a part of each of the first electrode and the second electrode, and the light-emitting elements may be disposed between the first electrode and the second electrode exposed by the bank.

At least a part of a space defined by the bank may be filled with the light-transmitting layer.

The wavelength control layer may be disposed in the space defined by the bank.

The light-transmitting layer may overlap the light-emitting elements and the wavelength control layer in a plan view, and the light-transmitting layer may contact a side surface of the bank.

The bank may comprise a lower bank; and an upper bank disposed on and overlapping the lower bank in a plan view, the light-transmitting layer may be disposed in a space defined by the lower bank, and the wavelength control layer may be disposed in a space defined by the upper bank.

The light-transmitting layer may be disposed between the lower bank and the upper bank in a plan view.

The light-transmitting layer may be disposed between the light-emitting elements and the wavelength control layer.

The pixels may comprise a first pixel displaying a first color; and a second pixel displaying a second color, and the wavelength control layer may comprise a first wavelength conversion pattern disposed in the first pixel and converting light of a third color into light of the first color; and a second wavelength conversion pattern disposed in the second pixel and converting the light of the third color into the light of the second color.

The display device may further comprise contact electrodes disposed on the light-emitting elements. The contact electrodes may comprise a first contact electrode electrically connecting the first electrode with first ends of the light-emitting elements; and a second contact electrode electrically connecting the second electrode with second ends of the light-emitting elements.

The light-transmitting layer may be disposed on the contact electrodes.

The display device may further comprise a first capping layer disposed between the wavelength control layer and the light-transmitting layer.

The display device may further comprise a second capping layer disposed on the wavelength control layer.

According to an embodiment, a display device may comprise pixels; a first electrode and a second electrode disposed in each of the pixels and spaced apart from each other on a substrate; light-emitting elements disposed between the first electrode and the second electrode; a wavelength control layer disposed above the light-emitting elements; and a light-transmitting layer disposed between the light-emitting elements and the wavelength control layer, wherein the pixels may comprise a first pixel displaying a first color and a second pixel displaying a second color, the wavelength control layer may comprise a first wavelength conversion pattern that is disposed in the first pixel and converts light of a third color into light of the first color, and a second wavelength conversion pattern that is disposed in the second pixel and converts the light of the third color into light of the second color, and a refractive index of the light-transmitting layer may be smaller than a refractive index of each of the first wavelength conversion pattern and the second wavelength conversion pattern.

The refractive index of the light-transmitting layer may be in a range of about 1.2 to about 1.5.

The display device may further comprise a bank disposed along a boundary of each of the pixels on the substrate, wherein the bank may expose a part of each of the first electrode and the second electrode, the light-emitting elements may be disposed between the first electrode and the second electrode exposed by the bank, and a space defined by the bank may be at least partially filled with the light-transmitting layer.

The bank may comprise a lower bank; and an upper bank disposed on and overlapping the lower bank in a plan view, the light-transmitting layer may be disposed in a space defined by the lower bank, and the wavelength control layer may be disposed in a space defined by the upper bank.

The light-transmitting layer may be disposed between the lower bank and the upper bank in a plan view.

The light-transmitting layer may be disposed between the light-emitting elements and the wavelength control layer.

A size of the upper bank may be greater than a size of the lower bank in a plan view.

According to an example embodiment of the disclosure, the light-transmitting layer may be disposed between light-emitting elements and a wavelength control layer. The light-transmitting layer may disperse lights emitted from light-emitting elements, each of which is a point light source, so that the lights are guided as if they are emitted from a surface light source. Accordingly, by dispersing the light emitted from the light-emitting elements and incident on a wavelength control layer, the area of the wavelength control layer on which the light is incident can become larger, and the light incident on the wavelength control layer can be uniformly distributed. If the area of the wavelength control layer on which the light emitted from the light-emitting elements is incident increases, the amount of the incident light per area of the wavelength control layer can be reduced. Accordingly, the distribution of the light incident on the wavelength control layer is uniform and the incidence area is increased, so that it is possible to prevent the wavelength control layer from being damaged by thermal energy of the light incident on the wavelength control layer. As a result, the display quality of the display device can be improved.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail example embodiments thereof with reference to the attached drawings, in which.

DETAILED DESCRIPTION OF THE EMBODIMENTS

Figure 1:
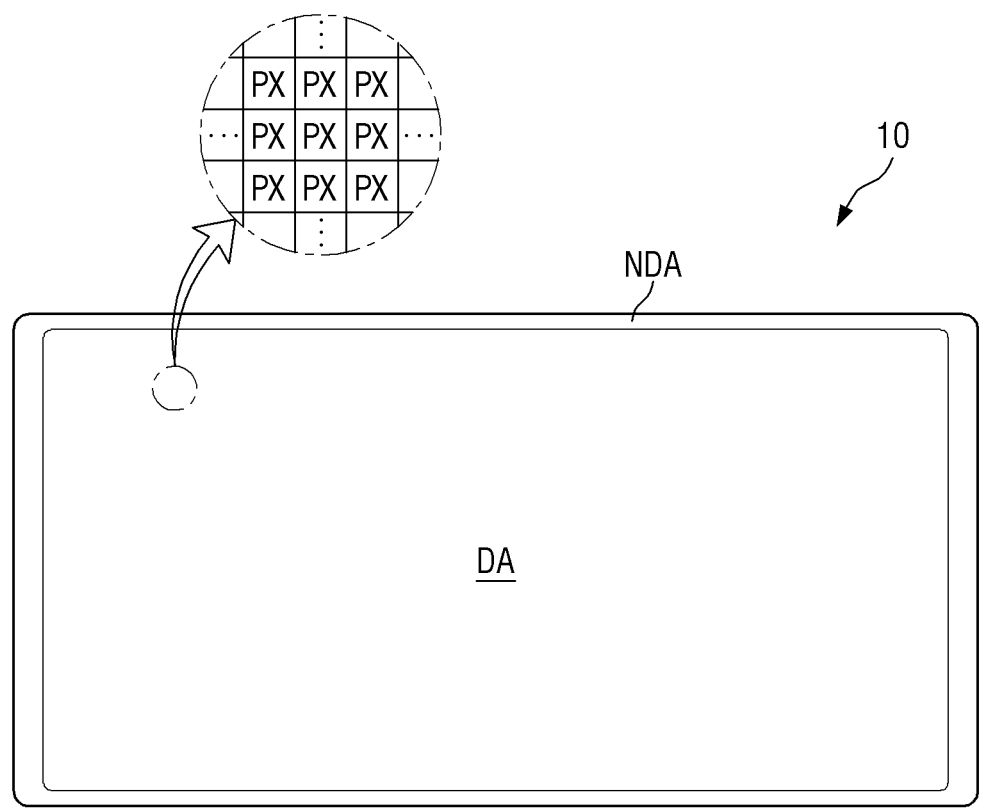
FIG. 1 is a schematic plan view of a display device according to an example embodiment of the disclosure.

Advantages and features of the disclosure and methods to achieve them will become apparent from the descriptions of example embodiments hereinbelow with reference to the accompanying drawings. However, the disclosure may be modified in many different ways and it should not be considered to be limited to the embodiments set forth herein.

It will be understood that when an element or layer is referred to as being "on" another element or layer, the element or layer can be directly on another element or layer or intervening elements or layers may also be present. In contrast, when an element is referred to as being "directly on" another element, there is no intervening element present.

The same or similar elements are herein designated by like reference numerals.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, example embodiments of the disclosure will be described with reference to the accompanying drawings.

FIG. 1 is a schematic plan view of a display device according to an example embodiment of the disclosure.

Referring to FIG. 1, a display device 10 may display a moving image or a still image. A display device 10 may refer to any electronic device that provides a display screen. For example, the display device 10 may include a television set, a laptop computer, a monitor, an electronic billboard, Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Any other display panel may be employed as long as the technical idea of the disclosure can be equally applied.

A first direction DR1, a second direction DR2 and a third direction DR3 are defined in the drawings. The display device 10 according to the example embodiments of the disclosure will be described with reference to the drawings. The first direction DR1 may be perpendicular to the second direction DR2 in a plane The third direction DR3 may be perpendicular to the plane where the first direction DR1 and the second direction DR2 are located. The third direction DR3 may be perpendicular to each of the first direction DR1 and the second direction DR2. In the following description of the display devices 10 according to the example embodiments of the disclosure, the third direction DR3 refers to the thickness direction of the display device 10.

The display device 10 may have a rectangular shape including longer sides in the first direction DR1 and shorter sides in the second direction DR2 when viewed from the top (or in a plan view). Although the corners where the longer sides and the shorter sides of the display device 10 meet may form a right angle, this is merely illustrative. The display device 1 may have rounded corners. The shape of the display device 10 when viewed from the top is not limited to that shown. The display device 10 may have other shapes such as a square, a rectangle with rounded corners (vertices), other polygons and a circle.

A display surface may be located on one side of the display device 10 in the third direction DR3, i.e., the thickness direction. In the following description, the upper side of the display device 10 refers to the side in the third direction DR3 where images are displayed, and the upper surface of the display device 10 refers to the surface facing the side in the third direction DR3, unless specifically stated otherwise. In addition, the lower portion refers to the opposite side in the third direction DR3, and likewise the lower surface refers to a surface facing the opposite side in the third direction DR3. As used herein, the terms "left," "right," "upper" and "lower" sides refer to relative positions when the display device 10 is viewed from the top. For example, the right side refers to one side in the first direction DR1, the left side refers to the other side in the first direction DR1, the upper side refers to one side in the second direction DR2, and the lower side refers to the other side in the second direction DR2.

The display device 10 may include the display area DA and a non-display area NDA. In the display area DPA, images can be displayed. In the non-display area NDA, images are not displayed.

The shape of the display area DA may follow the shape of the display device 10. For example, the shape of the display area DA may have a rectangular shape generally similar to the shape of the display device 10 when viewed from the top. The display area DA may generally occupy the center of the display device 10.

The display area DA may include pixels PX. The pixels PX may be arranged in a matrix. The shape of each of the pixels PX may be rectangular or square when viewed from the top. It is, however, to be understood that the disclosure is not limited thereto. The shape of each of the pixels PX may have a diamond shape having the sides inclined with respect to a direction. The pixels PX may be arranged in stripes or the PenTile pattern alternately.

The non-display areas NDA may be disposed around the display area DA. The non-display area NDA may surround the display area DA entirely or partially. According to an example embodiment of the disclosure, the display area DA may have a rectangular shape, and the non-display areas NDA may be disposed to be adjacent to the four sides of the display area DA. The non-display area NDA may form the bezel of the display device 10. Lines, circuit drivers included in the display device 10, or pad areas on which external devices are mounted may be disposed in the non-display areas NDA.

Figure 2:
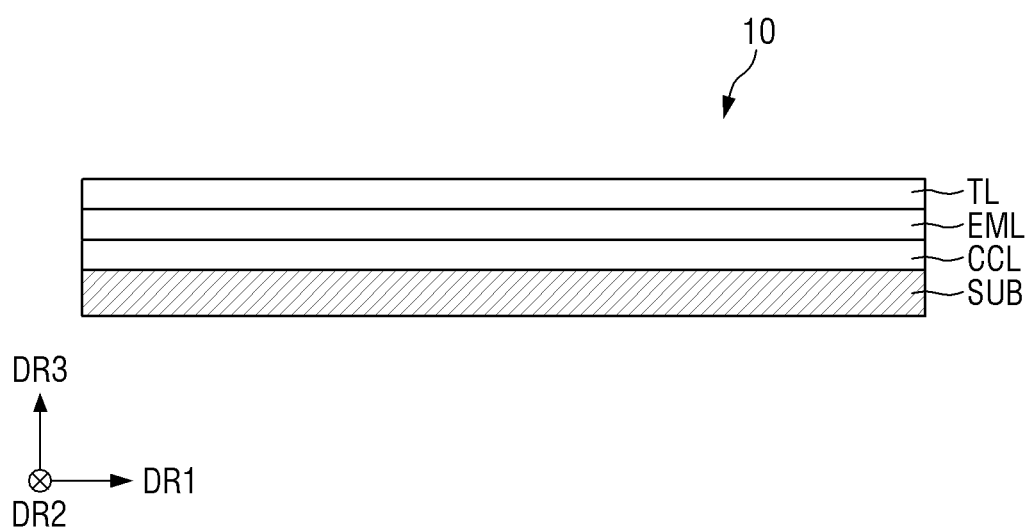
FIG. 2 is a schematic cross-sectional view of a display device according to an example embodiment of the disclosure.
Figure 3:
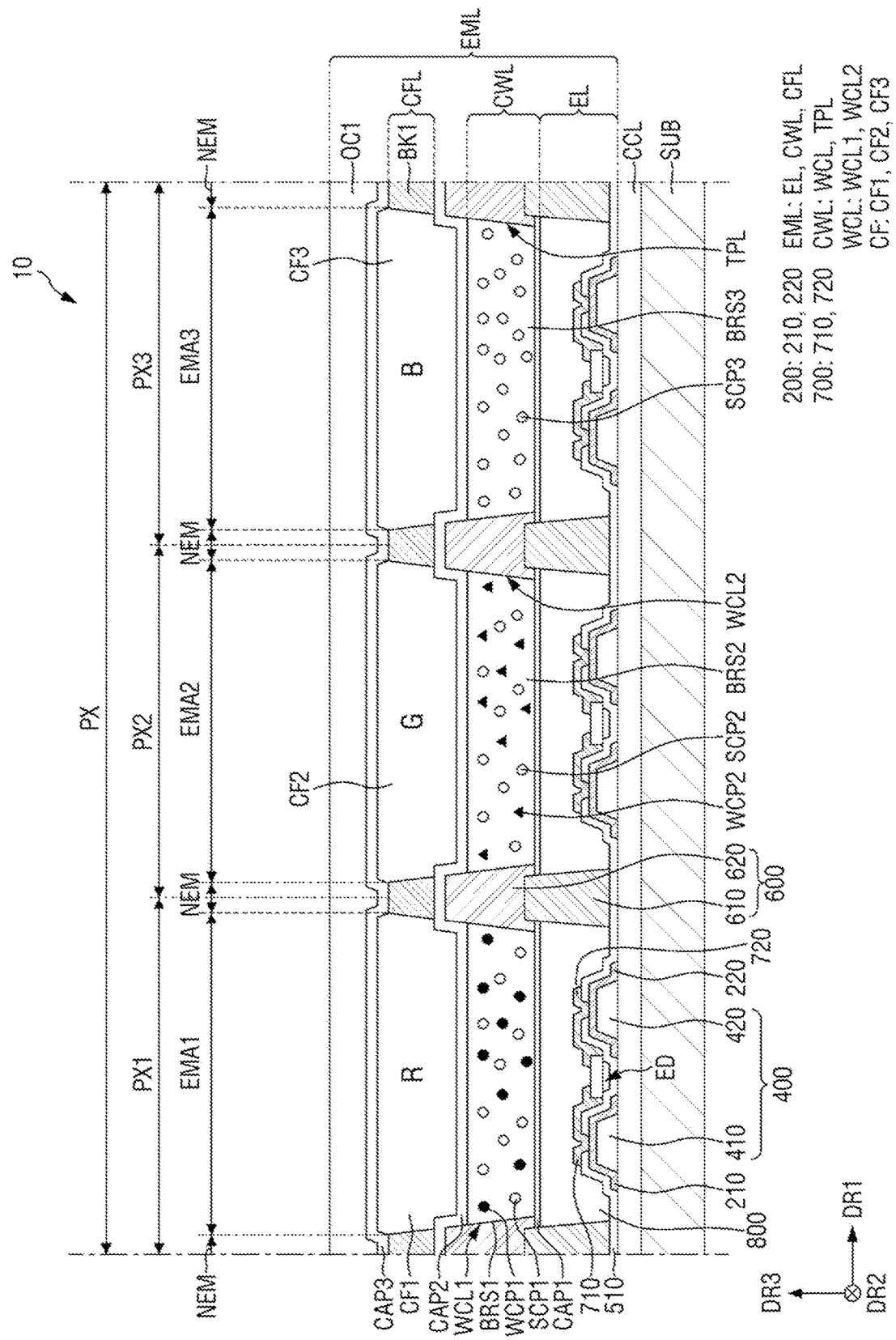
FIG. 3 is a schematic cross-sectional view of a display device according to an example embodiment of the disclosure.

FIG. 2 is a schematic cross-sectional view of a display device according to an example embodiment of the disclosure. FIG. 3 is a cross-sectional view of a display device according to an example embodiment of the disclosure.

Referring to FIGS. 1 to 3, the display area DA of the display device 10 includes pixels PX arranged in rows and columns, as described above. Each of the pixels PX may refer to a repeating minimum unit for displaying images.

In order to display full color, each of the pixels PX may include sub-pixels PXn that emits different colors, where n is a natural number from 1 to 3. For example, each of the pixels PX may include a first sub-pixel PX1 responsible for emitting light of a first color, a second sub-pixel PX2 responsible for emitting light of a second color, and a third sub-pixel PX3 responsible for emitting light of a third color. For example, the first color may be red, the second color may be green, and the third color may be blue. Although a pixel PX includes three sub-pixels PXn in the drawings, the disclosure is not limited thereto. For example, each of the pixels PX may include a greater number of sub-pixels PXn.

Each of the sub-pixels PXn may include an emission area EMA and a non-emission area NEM around it. Specifically, the first sub-pixel PX1 may include a first emission area EMA1, the second sub-pixel PX2 may include a second emission area EMA2, and the third sub-pixel PX3 may include a third emission area EMA3.

In the first to third emission areas EMA1, EMA2 and EMA3, light emitted from a display layer EML of the display device 10 to be described later exits. In the non-emission area NEM, no light emitted from the display layer EML is transmitted. The light of the first color may exit in the first emission area EMA1, the light of the second color may exit in the second emission area EMA2, and the light of the first color may exit in the third emission area EMA3. For example, the first color may be red, the second color may be green, and the third color may be blue.

The non-emission area NEM may be disposed to surround the first emission area EMA1, the second emission area EMA2, and the third emission area EMA3. The first emission area EMA1, the second emission area EMA2 and the third emission area EMA3 may be distinguished by the non-emission area NEM.

The display device 10 may include a substrate SUB, a circuit element layer CCL disposed on the substrate SUB, a display layer EML disposed on the circuit element layer CCL, and a touch layer TL disposed on the display layer EML.

The substrate SUB may be a base substrate or a base member and may be made of (or may include) an insulating material such as a polymer resin. The substrate SUB may be made of an insulating material such as glass, quartz and a polymer resin. The substrate SUB may be either a rigid substrate or a flexible substrate that can be bent, folded, or rolled.

The circuit element layer CCL may be disposed on the substrate SUB. The circuit element layer CCL may be disposed on a surface of the substrate SUB to drive the pixels PX. The circuit element layer CCL may include at least one transistor or the like to drive a light-emitting element layer EL.

The display layer EML may be disposed on the substrate SUB. The display layer EML may include the light-emitting element layer EL, a wavelength control layer CWL, and a color filter layer CFL.

The light-emitting element layer EL may be disposed on a surface of the circuit element layer CCL. The light-emitting element layer EL may include pixels each including a first electrode, an emissive layer and a second electrode. In some example embodiments, the emissive layer may include an inorganic light-emitting diode. It should be understood that the disclosure is not limited thereto. In some other example embodiments, the emissive layer may include an organic light-emitting diode.

The light-emitting element layer EL may include a first bank 400, a second bank 600, an electrode layer 200, a contact electrode 700, light-emitting diodes (or light-emitting elements) ED, a first insulating layer 510 and a light-transmitting layer 800.

The first bank 400 may be disposed on the circuit element layer CCL. The first bank 400 may comprise one or more banks. The first bank 400 may be disposed in each of the first to third emission areas EMA1, EMA2 and EMA3, which are the emission areas EMA of the first to third sub-pixels PX1, PX2, and PX3, respectively. The first bank 400 disposed in each of the first to third emission areas EMA1, EMA2 and EMA3 may include sub-banks. The sub-banks may be spaced apart from one another. For example, the first bank 400 may include a first sub-bank 410 and a second sub-bank 420 spaced apart from each other.

The electrode layer 200 may be disposed on the first bank 400. The electrode layer 200 may include a first electrode 210 and a second electrode 220 spaced apart from each other. The first electrode 210 may be disposed on the first sub-bank 410, and the second electrode 220 may be disposed on the second sub-bank 420.

The first insulating layer 510 may be disposed on the first and second electrode 210 and 220. The first insulating layer 510 may be disposed on the first electrode 210 and the second electrode 220, and may expose at least parts of the first electrode 210 and the second electrode 220.

The second bank 600 may be disposed on the first insulating layer 510. The second bank 400 may comprise one or more banks. The second bank 600 may be disposed in the non-emission area NEM along the borders (or boundary) of the first to third sub-pixels PX1, PX2, and PX3. The second bank 600 may include an opening exposing the first bank 400 and the light-emitting diodes ED disposed in each of the first to third emission areas EMA1, EMA2 and EMA3. The opening included in the second bank 600 may also expose some parts of the first electrode 210 and the second electrode 220 disposed in each of the first to third emission areas EMA1, EMA2 and EMA3.

The second bank 600 may include a lower bank 610 and an upper bank 620. During an inkjet printing process for aligning the light-emitting diodes ED of the process of fabricating the display device 10, the lower bank 610 may work as partition walls which prevents that the ink in which the light-emitting diodes ED is dispersed is mixed into the adjacent sub-pixel PXn so that the ink can be ejected into the emission area EMA. The lower bank 610 may include an organic insulating material, for example, an organic material such as polyimide (PI).

A reflective layer may be further disposed on a side surface of the lower bank 610. In case that the reflective layer is further disposed on the side surface of the lower bank 610, it may serve to reflect the traveling direction of light that is emitted from the light-emitting diodes ED and travels toward the side surface of the lower bank 610 toward the display side.

The light-emitting diodes ED may be disposed on the first insulating layer 510 between the first sub-bank 410 and the second sub-bank 420. The light-emitting diodes ED may be disposed between the first electrode 210 and the second electrode and 220 so that their ends are disposed on the first insulating layer 510 between the first electrode 210 and the second electrode 220.

The light-emitting diodes ED may be disposed in the emission areas EMA1, EMA2 and EMA3 of the first to third sub-pixels PX1, PX2, and PX3, respectively. The light-emitting diodes ED may be disposed in each of the sub-pixels PX1, PX2, and PX3. The light-emitting diodes ED may be disposed between the first electrode 210 and the second electrode 220 exposed by the opening defined by the second bank 600.

Each of the light-emitting diodes ED may emit light in a particular or selected wavelength range. For example, the light-emitting diodes ED may emit light of the third color or blue light having a peak wavelength in the range of about 480 nm or less, or about 445 nm to about 480 nm or less. It should be understood that the disclosure is not limited thereto. The light-emitting diodes ED may emit green light or red light.

The contact electrodes 700 may be disposed on the light-emitting diodes ED. The contact electrodes 700 may be in contact with (or may contact) the first and second electrodes 210 and 220 and the light-emitting diodes ED exposed by the first insulating layer 510. The contact electrodes 700 may be in contact with the first and second electrodes 210 and 220 and the light-emitting diodes ED, to electrically connect between them.

The contact electrodes 700 may include a first contact electrode 710 and a second contact electrode 720 spaced apart from each other. The first contact electrode 710 and the second contact electrode 720 may be electrically insulated from each other.

The first contact electrode 710 may be disposed on the first electrode 210, and the second contact electrode 720 may be disposed on the second electrode 220. The first contact electrode 710 may electrically connect the first electrode 210 with first ends of the light-emitting diodes ED. The first contact electrode 710 may be in contact with a part of the first electrode 210 that is exposed by the first insulating layer 510 and the first ends of the light-emitting diodes ED. The second contact electrode 720 may electrically connect the second electrode 220 with second ends of the light-emitting diodes ED. The second contact electrode 720 may be in contact with a part of the second electrode 220 that is exposed by the first insulating layer 510 and the second ends of the light-emitting diodes ED. The first ends of the light-emitting diodes ED may be electrically connected to the first electrode 210 through the first contact electrode 710, and the second ends of the light-emitting diodes ED may be electrically connected to the second electrode 220 through the second contact electrode 720.

The light-transmitting layer 800 may be disposed in a region define by the lower bank 610. For example, the light-transmitting layer 800 may be disposed in the opening of the lower bank 610 exposing the light-emitting diodes ED. As described above, the light-transmitting layer 800 may be disposed to fill the opening defined by the lower bank 610. The light-transmitting layer 800 disposed in each of the sub-pixels PX1, PX2, and PX3 may be spaced apart from one another, with the lower bank 610 therebetween. The light-transmitting layer 800 may be in contact with a side surface of the lower bank 610. The light-transmitting layer 800 may be disposed on the contact electrodes 700. The light-transmitting layer 800 may be disposed over the contact electrodes 700 to cover elements disposed thereunder. The light-transmitting layer 800 may overlap a side surface of the lower bank 610 but may not overlap the upper surface of the lower bank 610.

The first capping layer CAP1 may be disposed on the light-transmitting layer 800. The first capping layer CAP1 may be in direct contact with the side surface of the lower bank 610. The first capping layer CAP1 may not be disposed along the entire surface of the display device 10 but may be disposed only on each of the emission areas EAM1, EMA2 and EMA3. The first capping layer CAP1 may encapsulate the light-transmitting layer 800. In addition, the first capping layer CAP1 may be disposed on the lower surface of the wavelength control layer CWL to encapsulate the wavelength control layer CWL. Since the first capping layer CAP1 encapsulates the lower surface of the wavelength control layer CWL, permeation of impurities such as moisture and air can be prevented, thereby preventing damage to the wavelength control layer CWL.

The first capping layer CAP1 may include an inorganic material. For example, the first capping layer CAP1 may include at least one of: silicon nitride, aluminum nitride, zirconium nitride, titanium nitride, hafnium nitride, tantalum nitride, silicon oxide, aluminum oxide, titanium oxide, tin oxide, cerium oxide and silicon oxynitride. Although the first capping layer CAP1 is made up of a single layer in the drawings, the disclosure is not limited thereto. For example, the first capping layer CAP1 may be made up of multiple layers in which inorganic layers including at least one of the materials listed above as materials that can be included by the first capping layer CAP1 are alternately stacked on one another.

The thickness of the light-transmitting layer 800 t1 (see FIG. 5) may be determined based on the thickness of the lower bank 610 and the thickness of the first capping layer CAP1. Specifically, the thickness t1 of the light-transmitting layer 800 may be smaller than the value obtained by subtracting the thickness of the first capping layer CAP1 from the thickness of the lower bank 610. For example, the thickness t1 of the light-transmitting layer 800 may be equal to or smaller than about 3 μm.

The light-transmitting layer 800 may be disposed in each of the first to third emission areas EMA1, EMA2 and EMA3, and may be disposed between the wavelength control layer CWL and the light-emitting diodes ED, which will be described later. The light-transmitting layer 800 may be disposed between the wavelength control layer CWL and the light-emitting diodes ED to disperse the lights emitted from the light-emitting diodes ED so that the lights are not concentrated. Specifically, the light-transmitting layer 800 may disperse the lights emitted from the light-emitting diodes ED and incident on the wavelength control layer CWL, so that the lights emitted from the light-emitting diodes ED are incident on the wavelength control layer CWL with a uniform luminance when viewed from the top.

The light-transmitting layer 800 may be coated over the light-emitting diodes ED in the first to third emission areas EMA1, EMA2 and EMA3 by inkjet printing or slot-die coating. The light-transmitting layer 800 may be formed by photo-curing or thermo-curing the coated material.

The upper bank 620 may be disposed on the first capping layer CAP1 and the lower bank 610. The upper bank 620 may be disposed at the boundaries between the first to third sub-pixels PX1, PX2, and PX3. The upper bank 620 may be disposed above the lower bank 610. The upper bank 620 may overlap the lower bank 610. The first cover member 610 may completely cover the driving IC 130 as shown in FIG. 3. In other words, the area of the upper bank 620 may be larger than the area of the lower bank 610 when viewed from the top. The upper bank 620 may be disposed in the non-emission area NEM, and may include an opening that defines each of the first to third emission areas EMA1, EMA2 and EMA3. The wavelength control layer CWL may be disposed in the opening defined by the upper bank 620.

The upper bank 620 may serve to block light emitted from the light-emitting element layer EL from being mixed into the emission areas EMA of the neighboring sub-pixels PXn. In addition, the upper bank 620 may also work as partition walls forming the wavelength control layer CWL.

The upper bank 620 may include an organic material. The upper bank 620 may include a light-absorbing material that absorbs light in a visible wavelength band. For example, the upper bank 620 may be made of a material used as a black matrix of the display device 10. The upper bank 620 may be a type of light-blocking member.

The light-transmitting layer 800 may be disposed between the lower banks 610 and/or the upper banks 620 (e.g., in a plan view), and may be disposed between (or adjacent to or abutting) the lower bank 610 and the first capping layer CAP1. The first capping layer CAP1 may be disposed between the light-transmitting layer 800 and the upper bank 620. For example, the lower bank 610 is formed, and then the light-transmitting layer 800 may be disposed between adjacent upper banks 620 on the lower bank 610 or between lower banks 610. The light-transmitting layer 800 may be in direct contact with the side surfaces of the adjacent lower bank 610. The light-transmitting layer 800 may be in direct contact with a part (or the lower end) of the side surfaces of adjacent lower banks 610, and may expose another part (or the upper end) of the side surfaces of the lower banks 610. The above-described first capping layer CAP1 may be disposed on the light-transmitting layer 800 and may be in direct contact with a part of the upper end of the side surfaces of the above-described adjacent lower banks 610 that is exposed by the light-transmitting layer 800. As shown in FIG. 3, the first capping layer CAP1 may also come in contact with a part of the upper end of the side surfaces of the adjacent lower banks 610 that is exposed by the light-transmitting layer 800 while exposing another part of the upper end. Since the upper bank 620 is disposed on the lower bank 610 and the first capping layer CAP1, the upper bank 620 may be in direct contact with the upper surface of the lower bank 610, and another part of the upper end of the lower bank 610 that is exposed by the light-transmitting layer 800 and the first capping layer CAP1. In an embodiment, the upper bank 620 may completely cover the lower bank 610 and may be in contact with the first capping layer CAP1 as well.

The wavelength control layer CWL may be disposed on the first capping layer CAP1. The wavelength control layer CWL may be disposed in the opening defined by the upper bank 620 on the first capping layer CAP1. The wavelength control layer CWL may be formed in the opening defined by the upper bank 620 by inkjet printing or the like.

The wavelength control layer CWL may transmit the lights emitted from the light-emitting element layer EL and incident on the wavelength control layer CWL with or without changing the wavelength.

The wavelength control layer CWL may be disposed above the light-emitting diodes ED. The wavelength control layer CWL may overlap the light-emitting diodes ED in the third direction DR3. The wavelength control layer CWL may be disposed above the light-emitting diodes ED and may transmit the lights emitted from the light-emitting diodes ED and incident on the wavelength control layer CWL with or without changing the wavelength.

The wavelength control layer CWL may include wavelength conversion layers WCL that convert the wavelengths of light incident on the wavelength control layer CWL, and a transparent pattern TPL that transmits light incident on the wavelength control layer CWL without changing the wavelength of the light.

The wavelength conversion layer WCL or the transparent pattern TPL may be disposed separately in each of the first to third sub-pixels PX1, PX2, and PX3. The wavelength conversion layers WCL or the transparent pattern TPL may be disposed in each of the emission areas EMA1, EMA2 and EMA3 of the first to third sub-pixels PX1, PX2, and PX3. Each of the wavelength conversion layers WCL and/or the transparent pattern TPL may be spaced apart from another adjacent one by the second bank 600 disposed in the non-emission area NEM.

The wavelength conversion layers WCL may be disposed in a sub-pixel in which lights incident from the light-emitting element layer EL includes a light of a color different from the color of the sub-pixel and this it is necessary to convert the wavelength of the light incident from the light-emitting element layer EL. The transparent pattern TPL may be disposed in a sub-pixel in which light incident from the light-emitting element layer EL has the same color as the color of the sub-pixel. According to an example embodiment of the disclosure, the wavelength conversion layer WCL may be disposed on each of the first sub-pixel PX1 and the second sub-pixel PX2, and the transparent pattern TPL may be disposed on the third sub-pixel PX3.

The wavelength conversion layers WCL may include a first wavelength conversion pattern WCL1 disposed in the first sub-pixel PX1, and a second wavelength conversion pattern WCL2 disposed in the second sub-pixel PX2.

The first wavelength conversion pattern WCL1 may be disposed in the first emission area EMA1 defined by the second bank 600 in the first sub-pixel PX1. The first wavelength conversion pattern WCL1 may be disposed on the light-transmitting layer 800 in the first emission area EMA1 defined by the second bank 600. The first wavelength conversion pattern WCL1 may be in contact with a surface of the light-transmitting layer 800 disposed in the first emission area EMA1. For example, the light-transmitting layer 800 may be disposed between the light-emitting diodes ED and the first wavelength conversion pattern WCL1 in the first emission area EMA1.

The first wavelength conversion pattern WCL1 may convert light incident from the light-emitting element layer EL into light of the first color and then output it. Specifically, the first wavelength conversion pattern WCL1 may convert light incident from the light-emitting element layer EL into blue light to output it.

The first wavelength conversion pattern WCL1 may include a first base resin BRS1, and first wavelength-converting particles WCP1 dispersed in the first base resin BRS1. The first wavelength conversion pattern WCL1 may further include first scattering particles SCP1 dispersed in the first base resin BRS1.

The second wavelength conversion pattern WCL2 may be disposed in the second emission area EMA2 defined by the second bank 600 in the second sub-pixel PX2. The second wavelength conversion pattern WCL2 may be disposed on the light-transmitting layer 800 in the second emission area EMA2 defined by the second bank 600. The second wavelength conversion pattern WCL2 may be in contact with a surface of the light-transmitting layer 800 disposed in the second emission area EMA2. For example, the light-transmitting layer 800 may be disposed between the light-emitting diodes ED and the second wavelength conversion pattern WCL2 in the second emission area EMA2.

The second wavelength conversion pattern WCL2 may convert light incident from the light-emitting element layer EL into light of the second color and then output it. Specifically, the second wavelength conversion pattern WCL2 may convert light incident from the light-emitting element layer EL into blue light to output it.

The second wavelength conversion pattern WCL2 may include a second base resin BRS2 and second wavelength-converting particles WCP2 dispersed in the second base resin BRS2. The second wavelength conversion pattern WCL2 may further include second scattering particles SCP2 dispersed in the second base resin BRS2.

The light transmission pattern TPL may be disposed in the third emission area EMA3 defined by the second bank in the third sub-pixel PX3. The transparent pattern TPL may be disposed on the light-transmitting layer 800 in the third emission area EMA3 defined by the second bank 600. The transparent pattern TPL may be in contact with the light-transmitting layer 800 disposed in the third emission area EMA3. For example, the light-transmitting layer 800 may be disposed between the light-emitting diodes ED and the transparent pattern TPL in the third emission area EMA3.

The transparent pattern TPL may output the light incident from the light-emitting element layer EL without changing its wavelength. Specifically, the transparent pattern TPL may output the light incident from the light-emitting element layer EL without changing its wavelength as blue light.

The transparent pattern TPL may include a third base resin BRS3. The transparent pattern TPL may further include third scattering particles SCP3 dispersed in the third base resin BRS3.

The first to third base resins BRS1, BRS2 and BRS3 may include a transparent organic material. For example, the first to third base resins BRS1, BRS2 and BRS3 may include an epoxy resin, an acrylic resin, a cardo resin, an imide resin, or the like. The first to third base resins BRS1, BRS2 and BRS3 may be made of, but is not limited to, the same material.

The first to third scattering particles SCP1, SCP2 and SCP3 may have refractive indices different from those of the first to third base resins BRS1, BRS2 and BRS3. The first to third scattering particles SCP1, SCP2 and SCP3 may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc. The first to third scattering particles SCP1, SCP2 and SCP3 may be made of, but is not limited to, the same material.

The first wavelength-converting particles WCP1 may convert the light of the third color or the light of the second color into the light of the first color, and the second wavelength-converting particles WCP2 may convert the light of the third color into the light of the second color. For example, the first wavelength-converting particles WCP1 may be a material that converts blue light into red light, or a material that converts green light into red light. In addition, the second wavelength-converting particles WCP2 may be a material that converts blue light into green light The first wave-converting particles WCP1 and the second wavelength-converting particles WCP2 may be quantum dots (QD), quantum bars, fluorescent material, or phosphorescent material. The quantum dots may include IV nanocrystals, II-VI compound nanocrystals, III-V compound nanocrystals, IV-VI nanocrystals, or combinations thereof.

A quantum dot may include a core and a shell overcoating the core. The core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si and Ge. The shell may include, but not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe. However, the embodiments are not limited thereto.

As the fluorescent material, inorganic fluorescent materials such as garnets, silicates, sulfides, oxynitrides, nitrides and aluminates may be used as an inorganic fluorescent material. The inorganic fluorescent material may include, but is not limited to, at least one of: Y3Al5O12:Ce3+ (YAG:Ce), Tb3Al5O12:Ce3+ (TAG:Ce), (Sr,Ba,Ca)2SiO4:Eu2+, (Sr,Ba,Ca,Mg,Zn)2Si(OD)4:Eu2+ D=F,Cl,S,N,Br, Ba2MgSi2O7:Eu2+, Ba2SiO4:Eu2+, Ca3(Sc,Mg)2Si3O12:Ce3+, (Ca,Sr)S:Eu2+, (Sr,Ca)Ga2S4:Eu2+, SrSi2O2N2:Eu2+, SiAlON:Ce3+, β-SiAlON:Eu2+, Ca-α-SiAlON:Eu2+, Ba3Si6O12N2:Eu2+, CaAlSiN3:Eu2+, (Sr,Ca)AlSiN3:Eu2+, Sr2Si5N8:Eu2+, (Sr,Ba)Al2O4:Eu2+, (Mg,Sr)Al2O4:Eu2+, BaMg2Al16O27:Eu2+. It should be understood that the disclosure is not limited thereto. The fluorescent material may include an organic fluorescent material. The fluorescent material may have a content range of about 5 to about 99% by weight of the total solids in the base resin.

The light-transmitting layer 800 disposed in each of the sub-pixels PXn may be interposed between the wavelength control layer CWL and the light-emitting diodes ED disposed in each of the sub-pixels PXn. Specifically, the light-transmitting layer 800 disposed in the first sub-pixel PX1 may be disposed between the first wavelength conversion pattern WCL1 and the light-emitting diodes ED disposed in the first emission area EMA1, the light-transmitting layer 800 disposed in the second sub-pixel PX2 may be disposed between the second wavelength conversion pattern WCL2 and the light-emitting diodes ED disposed in the second emission area EMA2, and the light-transmitting layer 800 disposed in the third sub-pixel PX3 may be disposed between the transparent pattern TPL and the light-emitting diodes ED disposed in the third emission area EMA3. The light-transmitting layer 800 and the wavelength control layer CWL disposed in each of the first to third emission areas EMA1, EMA2 and EMA3 may be spaced apart from one another, with the second bank 600 therebetween.

The display layer EML may further include a second capping layer CAP2. The second capping layer CAP2 may be disposed on the wavelength control layer CWL. For example, the second capping layer CAP2 may encapsulate the first wavelength conversion pattern WCL1, the second wavelength conversion pattern WCL2 and the transparent pattern TPL, to prevent damage or contamination to the first wavelength conversion pattern WCL1, the second wavelength conversion pattern WCL2 and the transparent pattern TPL.

The second capping layer CAP2 may include an inorganic material. For example, the second capping layer CAP2 may include at least one of: silicon nitride, aluminum nitride, zirconium nitride, titanium nitride, hafnium nitride, tantalum nitride, silicon oxide, aluminum oxide, titanium oxide, tin oxide, cerium oxide and silicon oxynitride. Although the second capping layer CAP2 is formed as a single layer in the drawings, the disclosure is not limited thereto. For example, the second capping layer CAP2 may be made up of (or may include) multiple layers in which inorganic layers including at least one of the materials listed above as materials that can be included by the second capping layer CAP2 are alternately stacked on one another.

The color filter layer CFL may be disposed on the second capping layer CAP2 in the display area DA. The color filter layer CFL may include the first light-blocking member BK1 and color filters CF disposed in the space defined by a first light-blocking member BK1.

The first light-blocking member BK1 may be disposed on the second capping layer CAP2. The first light-blocking member BK1 may be disposed on the second capping layer CAP2 in the non-emission area NEM along the boundaries of the first to third sub-pixels PX1, PX2, and PX3. The first light-blocking member BK1 may overlap the second bank 600 in the thickness direction of the display device 10 (e.g., in the third direction DR3).

The first light-blocking member BK1 may not only block emission of light but also suppress reflection of external light. The first light-blocking member BK1 may be formed in a lattice shape surrounding the first to third emission areas EMA1, EMA2 and EMA3 when viewed from the top.

The first light-blocking member BK1 may be made of a material including an organic material. According to an example embodiment of the disclosure, the first light-blocking member BK1 may include a light-absorbing material that absorbs light in the visible wavelength range. The first light-blocking member BK1 may include a light-absorbing material and disposed along the boundaries of the first to third sub-pixels PX1, PX2, and PX3, and the first light-blocking member BK1 may define first to third emission areas EMA1, EMA2 and EMA3.

The color filters CF may include a first color filter CF1, a second color filter CF2 and a third color filter CF3.

The first color filter CF1 may be disposed in the first emission area EMA1 of the first sub-pixel PX1, the second color filter CF2 may be disposed in the second emission area EMA2 of the second sub-pixel PX2, and the third color filter CF3 may be disposed in the third emission area EMA3 of the third sub-pixel PX3. The first to third color filters CF1, CF3 and CF3 may be surrounded by the first light-blocking member BK1.

The first to third color filters CF1, CF2 and CF3 may include a colorant such as a dye and a pigment that absorbs wavelengths other than a given color wavelength. The first color filter CF1 may selectively transmit light of the first color (e.g., red light) and may block and absorb light of the second color (e.g., green light) and light of the third color (e.g., blue light). The second color filter CF2 may selectively transmit light of the second color (e.g., green light) and may block and absorb light of the first color (e.g., red light) and light of the third color (e.g., blue light). The third color filter CF3 may selectively transmit light of the third color (e.g., blue light) and may block and absorb light of the first color (e.g., red light) and light of the second color (e.g., green light). For example, the first color filter CF1 may be a red color filter, the second color filter CF2 may be a green color filter, and the third color filter CF3 may be a blue color filter.

The first to third color filters CF1, CF2 and CF3 may absorb part of the light introduced from the outside of the display device 10 to reduce reflection of external light. Accordingly, the first to third color filters CF1, CF2 and CF3 can prevent color distortion due to reflection of external light.

The color filters CF are disposed on the first and second wavelength conversion patterns WCL1 and WCL2 and the transparent pattern TPL, and thus the display device 10 may require no additional substrate for the color filters CF. Therefore, the thickness of the display device 10 can be relatively reduced.

The third capping layer CAP3 may be disposed on the color filter layer CFL. The third capping layer CAP3 may be disposed on the first to third color filters CF1, CF2 and CF3 and the first light-blocking member BK1 to cover them. The third capping layer CAP3 may serve to protect the color filter layer CFL.

An overcoat layer OC1 may be disposed on the color filter layer CFL. The overcoat layer OC1 may serve to prevent permeation of oxygen or moisture into the wavelength control layer CWL and the light-emitting element layer EL disposed thereunder. To this end, the overcoat layer OC1 may include at least one inorganic film. The overcoat layer OC1 may be disposed to cover (or overlap, e.g., in a plan view) the color filter layer CFL, the wavelength control layer CWL, the light-emitting element layer EL, and the circuit element layer CCL disposed thereunder.

The touch layer TL may be disposed on the display layer EML. The touch layer TL may be disposed directly on the display layer EML. The touch layer TL may detect the location of a touch input from the outside. The touch layer TL may be of a rigid panel type, a flexible panel type, or a film type. It is, however, to be understood that the disclosure is not limited thereto. In some implementations, the touch layer TL may be eliminated.

Figure 4:
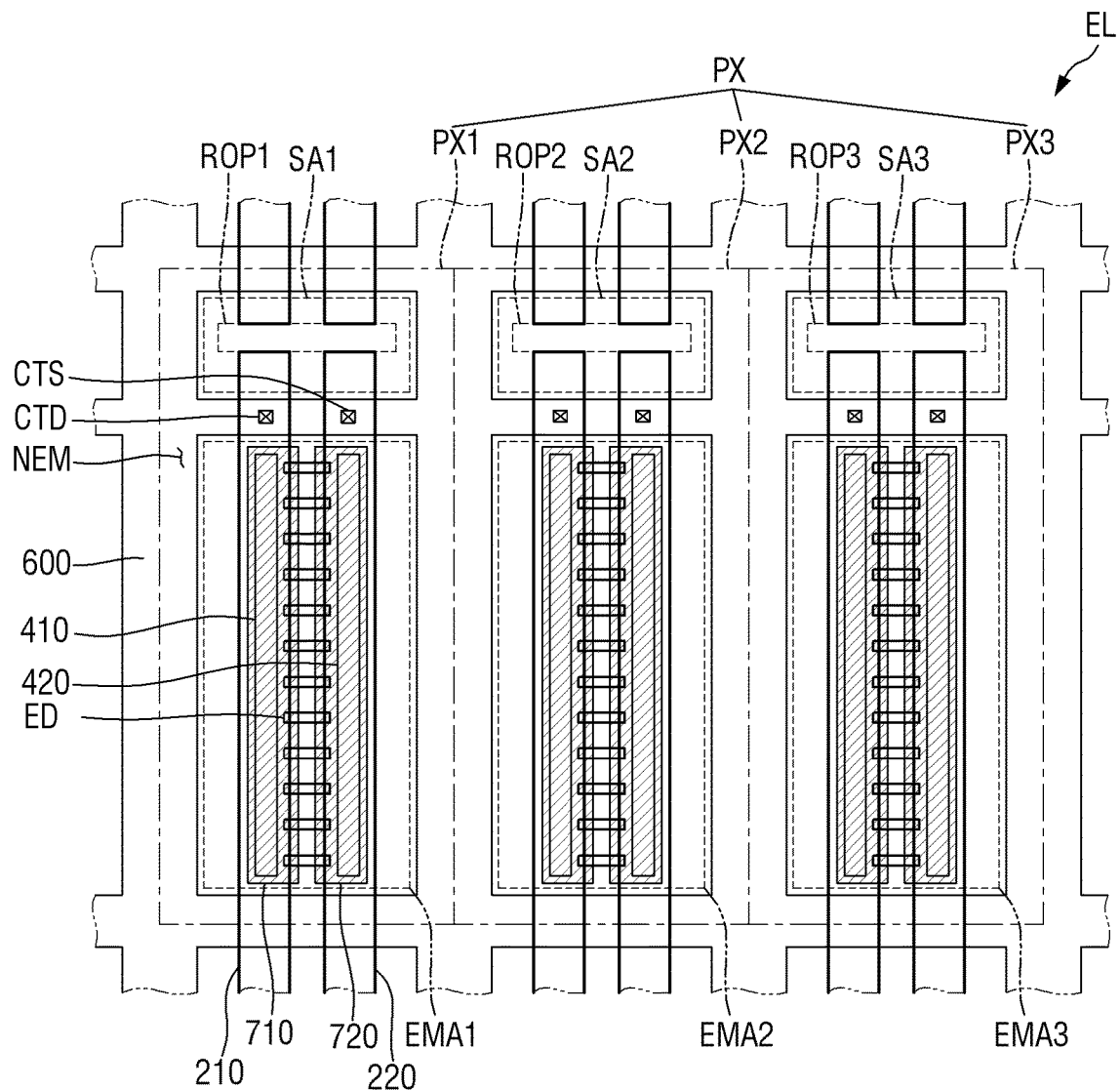
FIG. 4 is a schematic plan view showing a layout of a light-emitting element layer according to an example embodiment of the disclosure.

FIG. 4 is a schematic plan view showing a layout of a light-emitting element layer according to an example embodiment of the disclosure.

Referring to FIG. 4, the first to third sub-pixels PX1, PX2, and PX3 may have the same structure of the light-emitting element layer EL. Accordingly, in the following description of the light-emitting element layer EL, the description of the structure of the second and third sub-pixels PX2 and PX3 will be substantially identical or similar to the description of the structure of the first sub-pixel PX1.

The first sub-pixel PX1 of the light-emitting element layer EL may include the first emission area EMA1 and the non-emission area NEM, the second sub-pixel PX2 of the light-emitting element layer EL may include the second emission area EMA2 and the non-emission area NEM, and the third sub-pixel PX3 of the light-emitting element layer EL may include the third emission area EMA3 and the non-emission area NEM. In the first to third emission areas EMA1, EMA2 and EMA3, light emitted from the light-emitting diodes ED may exit. In the non-emission area NEM, light emitted from the light-emitting diodes ED does not reach and thus no light exits therefrom.

Each of the first to third emission area EMA1, EMA2 and EMA3 may include an area in which the light-emitting diodes ED are disposed and the periphery. In addition, the first to third emission areas EMA1, EMA2 and EMA3 may further include areas in which light emitted from the light-emitting diodes ED is reflected or refracted by other elements to exit.

The sub-pixels PXn may further include subsidiary areas SAn disposed in the non-emission area NEM, respectively, where n is a natural number of 1 to 3. Specifically, the first sub-pixel PX1 may include a first subsidiary area SA1 disposed in the non-emission area NEM, the second sub-pixel PX2 may include a second subsidiary area SA2 disposed in the non-emission area NEM, and the third sub-pixel PX3 may include a third subsidiary area SA3 disposed in the non-emission area NEM.

No light-emitting diodes ED may be disposed in the subsidiary areas SAn. The subsidiary areas SAn may be disposed on the upper side of the emission areas EMAn (or a side in the second direction DR2) in the sub-pixels PXn, respectively. For example, the first subsidiary area SA1 may be disposed on the upper side of the first emission area EMA1 in the first sub-pixel PX1, the second subsidiary area SA2 may be disposed on the upper side of the second emission area EMA2, and the third subsidiary area SA3 may be disposed on the upper side of the third emission area EMA3 in the third sub pixel PX3. For example, the subsidiary areas SAn may be disposed between the emission areas EMAn of the sub-pixels PXn adjacent to each other in the second direction DR2.

The subsidiary areas SAn may include separation regions ROPn, respectively. For example, the first subsidiary area SA1 may include a first separation region ROP1, the second subsidiary area SA2 may include a second separation region ROP2, and the third subsidiary area SA3 may include a third separation region ROP3. In each of the separation regions ROPn of the subsidiary areas SAn, a first electrode 210 and a second electrode 220 included the electrode layer 200 in a sub-pixel PXn may be separated from a first electrode 210 and a second electrode 220 in another sub-pixel PXn adjacent to the sub-pixel PXn in the second direction DR2, respectively.

Figure 5:
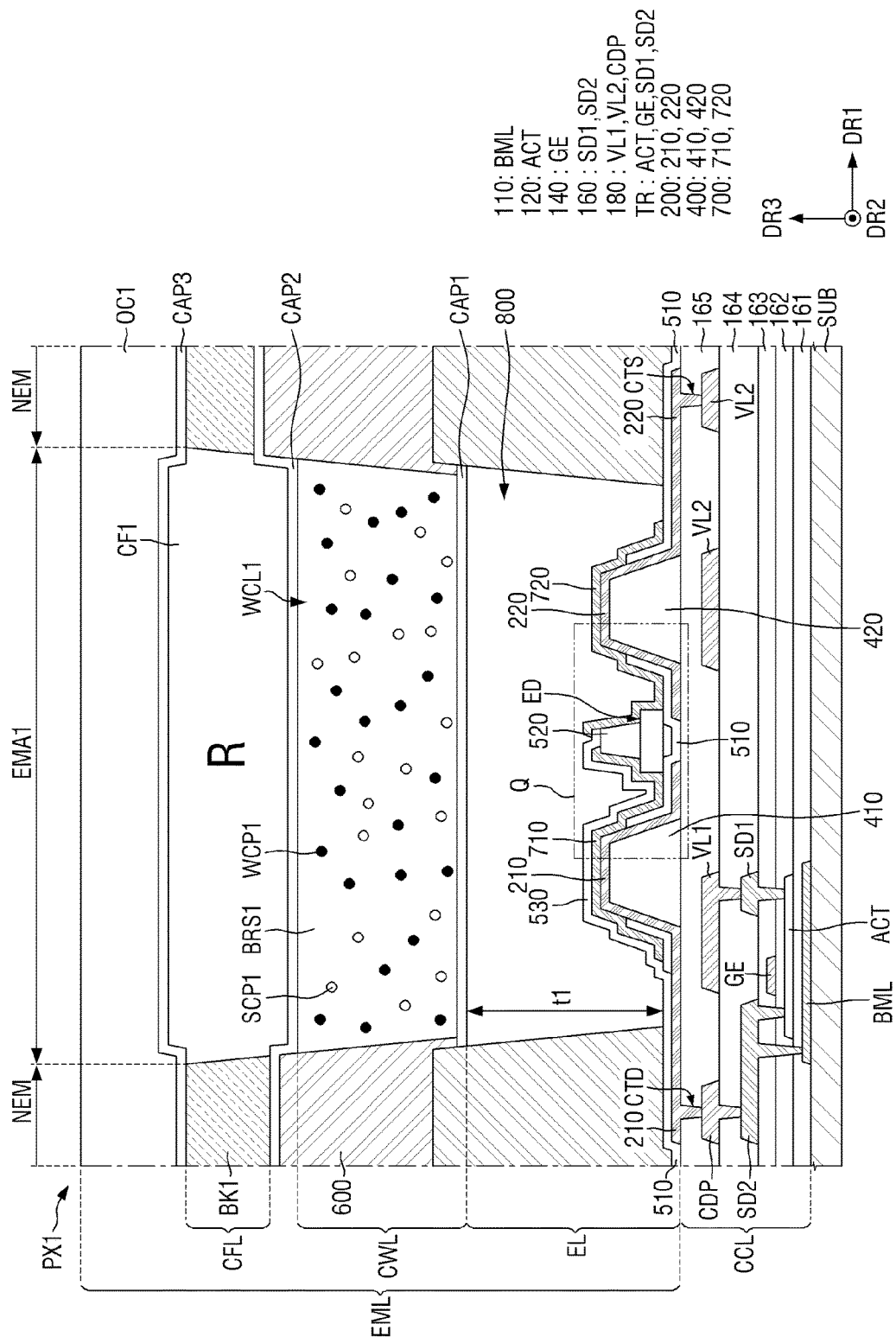
FIG. 5 is a schematic cross-sectional view showing an example of the first emission area of the first sub-pixel included in the display device of FIG. 3.
Figure 6:
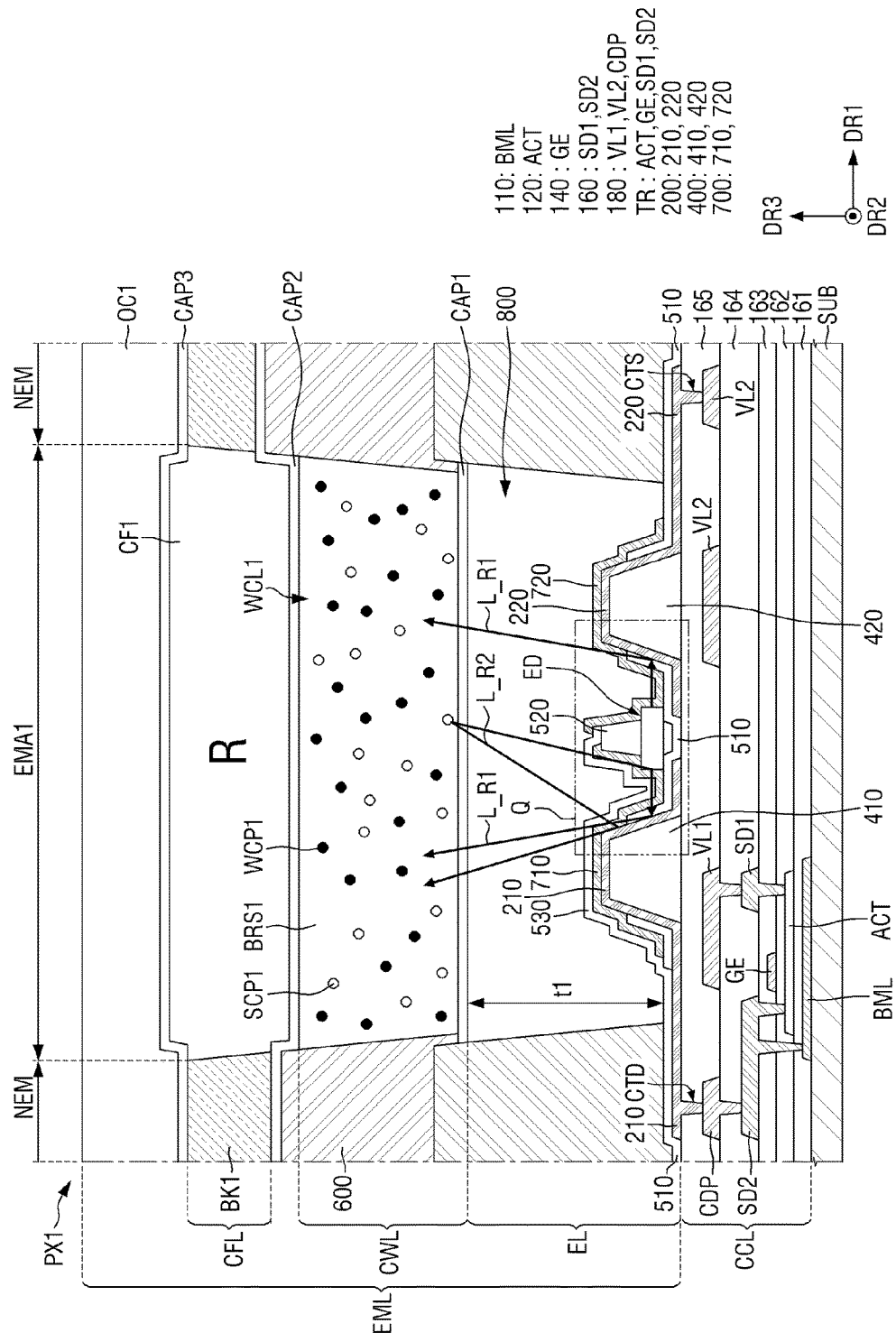
FIG. 6 is a schematic cross-sectional view showing paths of light emitted from a light-emitting diode of a display device according to an example embodiment.

FIG. 5 is a schematic cross-sectional view showing an example of the first emission area of the first sub-pixel included in the display device of FIG. 3. FIG. 6 is a schematic cross-sectional view showing paths of light emitted from a light-emitting diode of a display device according to an example embodiment.

Hereinafter, a structure of the circuit element layer CCL disposed on the substrate SUB will be described with reference to FIG. 5. It should be noted that FIG. 5 shows only the cross-sectional structure of the first sub-pixel PX1.

The circuit element layer CCL may include a lower metal layer 110, a buffer layer 161, first to third conductive layers 140, 160 and 180, a semiconductor layer 120, a gate insulator 162, an interlayer dielectric film 163, a passivation layer 164, and a via layer 165.

The lower metal layer 110 may be disposed on the substrate SUB. The lower metal layer 110 may include a metal pattern BML. The metal pattern BML, may be a light-blocking layer that protects the active material layer ACT (or semiconductor layer 120) of the transistor TR from external light. The lower metal layer 110 may include a material that blocks light. For example, the lower metal layer 110 may be made of an opaque metal material that blocks light transmission.

The metal pattern BML may be disposed under and may cover at least a channel region of the active material layer ACT of the transistor TR, and may further cover the entire active material layer ACT of the transistor TR. It is, however, to be understood that the disclosure is not limited thereto. In an embodiment, the metal pattern BML may not be included (or may be eliminated).

The buffer layer 161 may be disposed over the lower metal layer 110. The buffer layer 161 may be disposed to cover the entire surface of the substrate SUB on which the lower metal layer 110 is disposed. The buffer layer 161 can protect the transistor R from moisture permeating through the substrate SUB which is vulnerable to moisture permeation. The buffer layer 161 may be formed of inorganic layers stacked on one another alternately. For example, the buffer layer 161 may be made up of multiple layers in which inorganic layers including at least one of a silicon oxide ($SiO_x$), a silicon nitride ($SiN_x$) and silicon oxynitride ($SiO_xN_y$) are stacked on one another alternately.

The semiconductor layer 120 may be disposed on the buffer layer 161. The semiconductor layer 120 may include the active material layer ACT of the transistor TR. The active material layer ACT may be disposed to overlap the metal pattern BML, of the lower metal layer 110.

Although only one transistor TR of the transistors included in the first sub-pixel PX1 of the display device 10 is depicted in the drawing, the disclosure is not limited thereto. The first sub-pixel PX1 of the display device 10 may include a larger number of transistors. For example, the first sub-pixel PX1 of the display device 10 may include two or three transistors in each of the pixels PX.

The semiconductor layer 120 may include polycrystalline silicon, monocrystalline silicon, an oxide semiconductor, etc. According to an example embodiment of the disclosure, in case that the semiconductor layer 120 includes polycrystalline silicon, the polycrystalline silicon may be formed by crystallizing amorphous silicon. In case that the semiconductor layer 120 contains polycrystalline silicon, the active material layer ACT may include doped regions doped with impurities, and a channel region between them. In another example embodiment, the semiconductor layer 120 may include an oxide semiconductor. For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

The gate insulator 162 may be disposed on the semiconductor layer 120. The gate insulator 162 may work as a gate insulating layer of the transistor TR. The gate insulator 162 may be made up of an inorganic layer including an inorganic material, such as silicon oxide ($SiO_x$), silicon nitride ($SiN_x$) and silicon oxynitride ($SiO_xN_y$), or may be formed as a stack of such materials.

The first conductive layer 140 may be disposed on the gate insulator 162. The first conductive layer 140 may include the gate electrode GE of the transistor TR. The gate electrode GE may be disposed so that it overlaps the channel region of the active material layer ACT in the thickness direction, i.e., the third direction DR3.

The first conductive layer 140 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The interlayer dielectric film 163 may be disposed on the first conductive layer 140. The interlayer dielectric film 163 may be disposed to cover the first conductive layer 140 and may work as an insulating film between the first conductive layer 140 and other layers disposed thereon. The interlayer dielectric film 163 may be made up of multiple layers in which inorganic layers including inorganic insulating material, e.g., at least one of silicon oxide ($SiO_x$), silicon nitride ($SiN_x$) and silicon oxynitride ($SiO_xN_y$) are stacked on one another alternately.

A second conductive layer 160 is disposed on the interlayer dielectric film 163. The second conductive layer 160 may include a drain electrode SD1 of the transistor TR and a source electrode SD2 of the transistor TR.

The drain electrode SD1 and the source electrode SD2 of the transistor TR may be electrically connected to both end regions of the active material layer ACT of the transistor TR (e.g., doped regions of the active material layer ACT of the transistor TR), respectively, through contact holes penetrating through the interlayer dielectric film 163 and the gate insulator 162. In addition, the source electrode SD2 of the transistor TR may be electrically connected to the lower metal layer 110 through another contact hole penetrating through the interlayer dielectric film 163, the gate insulator 162, and the buffer layer 161.

The second conductive layer 160 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The passivation layer 164 is disposed on the second conductive layer 160. The passivation layer 164 covers and protects the second conductive layer 160. The passivation layer 164 may be made up of (or may include) multiple layers in which inorganic layers including inorganic insulating material, e.g., at least one of silicon oxide ($SiO_x$), silicon nitride ($SiN_x$) and silicon oxynitride ($SiO_xN_y$) are stacked on one another alternately.

The third conductive layer 180 is disposed on the passivation layer 164. The third conductive layer 180 may include a first voltage line VL1, a second voltage line VL2, and a first conductive pattern CDP.

A high-level voltage (or first supply voltage) to be supplied to the transistor TR may be applied to the first voltage line VL1, and a low-level voltage (or second supply voltage) which is lower than the high-level voltage (the first supply voltage) supplied to the first voltage line VL1 may be applied to the second voltage line VL2.

The first voltage line VL1 may be electrically connected to the transistor TR to supply the high-level voltage (the first supply voltage) to the transistor TR. Specifically, the first voltage line VL1 may be electrically connected to the drain electrode SD1 of the transistor TR through a contact hole penetrating through the passivation layer 164.

The second voltage line VL2 may be electrically connected to the second electrode 220 to apply the low-level voltage (second supply voltage) to the second electrode 220. In addition, an alignment signal necessary for aligning the light-emitting diodes ED during the process of fabricating the display device 10 may be applied to the second voltage line VL2.

The first conductive pattern CDP may be electrically connected to the source electrode SD2 of the transistor TR through a contact hole penetrating through the passivation layer 164. In addition, the first conductive pattern CDP may be electrically connected to the first electrode 210. The first conductive pattern CDP may transfer the first supply voltage applied from the first voltage line VL1 to the first electrode 210.

The third conductive layer 180 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The via layer 165 is disposed on the third conductive layer 180. The via layer 165 may be disposed on the passivation layer 164 on which the third conductive layer 180 is disposed. The via layer 165 may provide a flat surface. The via layer 165 may include an organic insulating material, for example, an organic material such as polyimide (PI).

Referring to FIGS. 4 and 5, the light-emitting element layer EL may be disposed on the via layer 165. The light-emitting element layer EL may include the electrode layer 200, the first bank 400, the second bank 600, light-emitting diodes ED, the contact electrode 700, insulating layers 510, 520 and 530, the light-transmitting layer 800.

The first bank 400 may be disposed on the via layer 165. The first bank 400 may be disposed directly on the upper surface of the via layer 165. The first bank 400 may be disposed in the emission area EMA.

The first bank 400 may have a shape extended in the second direction DR2 in the emission area EMA. The length of the first bank 400 in the second direction DR2 may be smaller than the length of the emission area EMA1 in FIG. 5 and FIG. 6 surrounded by the second bank 600 in the second direction DR2.

The first bank 400 may include sub-banks 410 and 420 spaced apart from each other in the emission area EMA (e.g., as shown in FIG. 5 and FIG. 6). The sub-banks 410 and 420 may have a shape extended in the second direction DR2 and may be spaced apart from one another in the first direction DR1. According to an example embodiment of the disclosure, the first bank 400 may include the first sub-bank 410 and the second sub-bank 420. The first sub-bank 410 may be disposed on the left side in the emission area EMA (e.g., as shown in FIG. 4) when viewed from the top. The second sub-bank 420 may be spaced apart from the first sub-bank 410 in the first direction DR1 to be disposed on the right side in the emission area EMA when viewed from the top. Light-emitting diodes ED may be disposed between the sub-banks 410 and 420 spaced apart from each other.

As the first bank 400 includes the inclined side surfaces, the light that is emitted from the light-emitting diodes ED and travels toward the side surfaces of the first bank 400 can be guided toward the upper side (e.g., display side). For example, the first bank 400 may provide the space where the light-emitting diodes ED are disposed and may also function as reflective partition walls that changes the traveling direction of light emitted from the light-emitting diodes ED toward the display side.

Although the side surfaces of the first bank 400 have an inclined linear shape in the drawings, the disclosure is not limited thereto. For example, the side surfaces (or outer surfaces) of the first bank 400 may have a shape of a curved semi-circle or semi-ellipse. According to an example embodiment of the disclosure, the first bank 400 may include, but is not limited to, an organic insulating material such as polyimide (PI).

The electrode layer 200 may be disposed on the first bank 400 and the via layer 165 exposed by the first bank 400. The electrode layer 200 may have a shape extended in a direction and may be disposed in each of the sub-pixels PXn. The electrode layer 200 may be extended in the second direction DR2 and may be disposed across the emission area EMA and the subsidiary area SA of the sub-pixel PXn. The electrode layer 200 may be disposed on the first bank 400 and the via layer 165 exposed by the first bank 400 in the emission area EMA, and on the via layer 165 in the non-emission area NEM.

The electrode layer 200 may include electrodes. The electrodes have a shape extended in the second direction DR2 and are spaced apart from one another in the first direction DR1. The electrode layer 200 may include a first electrode 210 and a second electrode 220 spaced apart from each other. At least a part of the first electrode 210 and the second electrode 220 may be disposed in the emission area EMA. As will be described later, at least a part of the first electrode 210 and the second electrode 220 in the emission area EMA may be exposed by the second bank 600.

The first electrode 210 may be disposed on the first sub-bank 410 in the emission area EMA, and the second electrode 220 may be disposed on the second sub-bank 420 in the emission area EMA. The first electrode 210 and the second electrode 220 may be disposed on at least inclined side surfaces of the first sub-bank 410 and the second sub-bank 420, respectively. The first and second electrodes 210 and 220 may be disposed to cover at least the side surfaces of the first and second sub-banks 410 and 420 facing each other, respectively, to reflect light emitted from the light-emitting diodes ED.

The first electrode 210 may be electrically connected to a first conductive pattern CDP1 through a first electrode contact hole CTD penetrating the via layer 165. The first electrode 210 may be in contact with the upper surface of the first conductive pattern CDP1 exposed by the first electrode contact hole CTD. The first electrode 210 may be electrically connected to the transistor TR through the first conductive pattern CDP1. Although the first electrode contact hole CTD is disposed to overlap the second bank 600 in the third direction DR3 in the example shown in the drawings, the position of the first electrode contact hole CTD is not limited thereto.

The second electrode 220 may be electrically connected to the second voltage line VL2 through a second electrode contact hole CTS penetrating the via layer 165. The second electrode 220 may be in contact with the upper surface of the second voltage line VL2 exposed by the second electrode contact hole CTS. The second supply voltage may be applied to the second electrode 220 through the second voltage line VL2. Although the second electrode contact hole CTS is disposed to overlap the second bank 600 in the third direction DR3 in the example shown in the drawings, the position of the second electrode contact hole CTS is not limited thereto.

The first electrode 210 and the second electrode 220 disposed in each of the sub-pixels PXn may be extended in the second direction DR2 when viewed from the top, and may be separated from the first electrode 210 and the second electrode 220 of another sub-pixel SPX adjacent to it in the second direction DR2 at the separation region ROP of the subsidiary area SA, respectively. Such arrangement of the first electrode 210 and the second electrode 220 spaced apart from each other in the second direction DR2 may be formed by forming electrode lines extended in the second direction DR2 which are used during a process of aligning light-emitting diodes ED and disposing the light-emitting diodes ED thereon, and then separating the electrode lines into parts at the separation region ROP of the subsidiary area SA during a subsequent process. The electrode lines may be used to generate an electric field in the pixels PX to align the light-emitting diodes ED during the process of fabricating the display device 10.

The first electrode 210 and the second electrode 220 may be electrically connected to the light-emitting diodes ED. The first electrode 210 and the second electrode 220 may be connected to both ends of the light-emitting diodes ED through first contact electrode 710 and the second contact electrode 720, respectively, and may transmit electric signals applied from the circuit element layer CCL to the light-emitting diodes ED.

The electrode layer 200 may include a conductive material having high reflectance. For example, the electrode layer 200 may include a metal such as silver (Ag), copper (Cu), aluminum (Al), molybdenum (Mo) and titanium (Ti) as the material having a high reflectance, and may be an alloy including aluminum (Al), nickel (Ni), lanthanum (La), etc. The electrode layer 200 may reflect light that is emitted from the light-emitting diodes ED and travels toward the side surfaces of the first bank 400 toward the upper side of each of the sub-pixels PXn. It is, however, to be understood that the disclosure is not limited thereto. The electrode layer 200 may further include a transparent conductive material. For example, the electrode layer 200 may include a material such as ITO, IZO and ITZO. In some example embodiments, the electrode layer 200 may have a structure in which one or more layers of a transparent conductive material and a metal layer having high reflectance are stacked on one another, or may be made up of a single layer including them. For example, the electrode layer 200 may have a stack structure such as ITO/Ag/ITO/, ITO/Ag/IZO, or ITO/Ag/ITZO/IZO.

The first insulating layer 510 may be disposed on the electrode layer 200. The first insulating layer 510 may be disposed to cover the electrode layer 200 and the via layer 165 exposed by the electrode layer 200. The first insulating layer 510 may include contacts exposing at least a part of the first electrode 210 and the second electrode 220. The contact electrodes 700 and the electrode layer 200 may be electrically connected to each other through the contacts exposing at least parts of the first electrode 210 and the second electrode 220. Although the contacts of the first insulating layer 510 exposing a part of the electrode layer 200 are disposed in the emission area EMA in the example shown in the drawings, the disclosure is not limited thereto. The contacts of the first insulating layer 510 exposing a part of the electrode layer 200 may be located in the subsidiary area SA of each of the sub-pixels PXn.

The first insulating layer 510 can protect the electrode layer 200, and can insulate the first electrode 210 and the second electrode 220 from each other. In addition, the first insulating layer 510 may also prevent that the light-emitting diodes ED disposed thereon are brought into contact with other elements and damaged. The first insulating layer 510 may include an inorganic insulating material.

The second bank 600 may be disposed on the first insulating layer 510. The second bank 600 may be disposed in a lattice pattern, including portions extended in the first direction DR1 and the second direction DR2 when viewed from the top.

The second bank 600 may be disposed at the boundaries of the sub-pixels PXn to distinguish between adjacent pixels PX, and may distinguish the emission area EMA from the subsidiary area SA of each of the sub-pixels PXn. In addition, the second bank 600 has a height greater than that of the first bank 400 to distinguish between the areas. Accordingly, during an inkjet printing process for aligning the light-emitting diodes ED of the process of fabricating the display device 10, it is possible to prevent that the ink in which the light-emitting diodes ED is dispersed is mixed into the adjacent sub-pixel PXn, and thus the ink can be ejected into the emission area EMA.

In addition, the second bank 600 may include an opening in line with the emission area EMA of each of the sub-pixels PXn to provide a space in which the light-transmitting layer 800 and the wavelength control layer CWL are formed. The second bank 600 may include an organic insulating material, for example, polyimide (PI), but the disclosure is not limited thereto.

The light-emitting diodes ED may be disposed on the first insulating layer 510 in the emission area EMA. The light-emitting diodes ED may be disposed between the first and second sub-banks 410 and 420. The light-emitting diodes ED may be disposed on the first insulating layer 510 so that both ends of the light-emitting diodes ED are positioned on the first electrode 210 and the second electrode 220, respectively, between the first sub-bank 410 and the second sub-bank 420.

The light-emitting diodes ED may be spaced apart from one another along the second direction DR2 in which the first and second electrodes 210 and 220 are extended, and may be aligned substantially parallel to one another. The light-emitting diodes ED may have a shape extended in a direction. The length of the light-emitting diodes ED may be larger than the shortest distance between the first electrode 210 and the second electrode 220 spaced apart from each other in the first direction DR1. At least one end of each of the light-emitting diodes ED may be disposed on one of the first electrode 210 and the second electrode 220, or both ends of each of the light-emitting diodes ED may be disposed on the first electrode 210 and the second electrode 220, respectively.

The second insulating layer 520 may be disposed on the light-emitting diodes ED. The second insulating layer 520 may be disposed to partially surround the outer surface of the light-emitting diodes ED so that the both ends of the light-emitting diodes ED are not covered. Accordingly, the width of the second insulating layer 520 in the first direction DR1 may be smaller than the length of the light-emitting diodes ED in the first direction DR1 in which the light-emitting diodes ED are extended. The part of the second insulating layer 520 which is disposed on the light-emitting diode ED may be extended in the second direction DR2 on the first insulating layer 510 when viewed from the top (or in a plan view), thereby forming a linear or island-like pattern in each of the sub-pixels PXn. The second insulating layer 520 can protect the light-emitting diode ED and fix the light-emitting diode ED during the process of fabricating the display device 10.

The contact electrodes 700 may be disposed on the second insulating layer 520. The contact electrodes 700 may include contact electrodes spaced apart from one another. For example, the contact electrodes 700 may include a first contact electrode 710 and a second contact electrode 720 spaced apart from each other.

The first contact electrode 710 may be disposed on the first electrode 210 and the second insulating layer 520. The first contact electrode 710 may be disposed to expose a part of the upper surface of the second insulating layer 520.

The first contact electrode 710 may have a shape extended in the second direction DR2. The first contact electrode 710 may be in contact with the first electrode 210 and the first ends of the light-emitting diodes ED. Specifically, the first contact electrode 710 may be in contact with the first ends of the light-emitting diodes ED exposed by the second insulating layer 520 in the emission area EMA. In addition, the first contact electrode 710 may be in contact with the first electrode 210 exposed by the contact penetrating the first insulating layer 510. The first contact electrode 710 is in contact with the first ends of the light-emitting diodes ED as well as the first electrode 210, to electrically connect the light-emitting diodes ED with the first electrode 210.

The third insulating layer 530 may be disposed on the first contact electrode 710. The third insulating layer 530 may be disposed on the first contact electrode 710 to cover the first contact electrode 710. The third insulating layer 530 may insulate the first contact electrode 710 from the second contact electrode 720. The third insulating layer 530 is disposed to cover the first contact electrode 710 and may be aligned with a sidewall of the second insulating layer 520.

The second contact electrode 720 may be disposed on the second electrode 220. The second contact electrode 720 may be disposed on the second electrode 220 and the third insulating layer 530.

The second contact electrode 720 may have a shape extended in the second direction DR2. The second contact electrode 720 may be in contact with the second electrode 220 and the second ends of the light-emitting diodes ED. Specifically, the second contact electrode 720 may be in contact with the second ends of the light-emitting diodes ED exposed by the second insulating layer 520 and the third insulating layer 530 in the emission area EMA. In addition, the second contact electrode 720 may be in contact with the second electrode 220 exposed by the contact penetrating the first insulating layer 510. The second contact electrode 720 is in contact with the second ends of the light-emitting diodes ED as well as the second electrode 220, to electrically connect the light-emitting diodes ED with the second electrode 220.

The first ends of the light-emitting diodes ED exposed by the second insulating layer 520 may be electrically connected to the first electrode 210 through the first contact electrode 710, while the second ends of the light-emitting diodes ED exposed by the second insulating layer 520 and the third insulating layer 530 may be electrically connected to the second electrode 220 through the second contact electrode 720.

Although the first contact electrode 710 and the second contact electrode 720 are formed on different layers with the third insulating layer 530 therebetween in the example shown in the drawings, the disclosure is not limited thereto. For example, the first contact electrode 710 and the second contact electrode 720 may be formed on substantially the same layer and may be spaced apart from each other with the second insulating layer 520 therebetween. In such case, the third insulating layer 530 may be eliminated.

The contact electrodes 700 may include a conductive material. For example, the contact electrodes 700 may include ITO, IZO, ITZO, aluminum (Al), etc. For example, the contact electrodes 700 may include a transparent conductive material. The light emitted from the light-emitting diodes ED may transmit the contact electrodes 700 to proceed toward the first electrode 210 and the second electrode 220, and may be reflected off the outer surface of the first electrode 210 and the second electrode 220.

The light-transmitting layer 800 may be disposed over the light-emitting diodes ED and the contact electrodes 700. The light-transmitting layer 800 may be disposed over the third insulating layer 530 to cover elements disposed thereunder. The light-transmitting layer 800 is identical to that described above with reference to FIG. 3; and, therefore, the redundant description will be omitted.

The light-emitting diodes ED disposed in the emission area EMA may be particle-type elements and may have a size of a nanometer scale (from about 1 nm to about 1 μm) to a micrometer scale (from about 1 μm to about 1 mm). Each of the light-emitting diodes ED may be a point light source that emits light from its active layer 33 as described below. The light-emitting diodes ED may be closely aligned between the first electrode 210 and the second electrode 220 in the emission area EMA. Lights are randomly emitted from the light-emitting diodes ED through the outer surface of the light-emitting diodes ED. However, the light-emitting diodes ED are point light sources and are densely aligned in the center of the emission area EMA. Therefore, the lights emitted from the light-emitting diodes ED may be densely distributed at the center of the emission area EMA in which the light-emitting diodes ED are arranged when viewed from the top.

Referring to FIGS. 5 and 6, the light-transmitting layer 800 may serve to guide the lights L emitted from the light-emitting diodes ED at the center of the emission area EMA as if the lights are emitted from a surface light source. Specifically, lights emitted from the light-emitting diodes ED may be reflected off the first electrode 210 or the second electrode 220 and travel L_R1 toward the first wavelength conversion pattern WCL1 (L_R1). If the first wavelength conversion pattern WCL1 is disposed over the light-emitting diodes ED without the light-transmitting layer 800, the lights emitted from the light-emitting diodes ED may be scattered by the first scattering particles SCP1 such that they may be much less reflected off the first electrode 210 or the second electrode 220.

Accordingly, the lights emitted from the light-emitting diodes ED may be concentrated on a particular location of the first wavelength conversion pattern WCL1 because each of the light-emitting diodes ED is a point light source. In case that this happens, the amount of incident light per plane area of the first wavelength conversion pattern WCL1 is increased, and thus the first wavelength conversion pattern WCL1 may be damaged by thermal energy of the light incident on the first wavelength conversion pattern WCL1. As a result, the display quality of the display device may be deteriorated.

In contrast, in the display device 10 according to the example embodiment of the disclosure, the light-transmitting layer 800 is disposed between the first wavelength conversion pattern WCL1 and the light-emitting diodes ED, so that the lights emitted from the light-emitting diodes ED, each of which is a point light source, may be dispersed as if they are emitted from a surface light source. Accordingly, by dispersing the lights emitted from the light-emitting diodes ED and incident on the first wavelength conversion pattern WCL1, it is possible to increase the area of the first wavelength conversion pattern WCL1 on which the lights are incident, and to control the distribution of the lights incident on the first wavelength conversion pattern WCL1 uniformly. Accordingly, the distribution of the lights incident on the first wavelength conversion pattern WCL1 is uniform and the area on which the lights are incident on the first wavelength conversion pattern WCL1 increases, so that it is possible to prevent the first wavelength conversion pattern WCL1 from being damaged by thermal energy of the lights incident on the first wavelength conversion pattern WCL1. As a result, the display quality of the display device 10 can be improved.

Incidentally, the refractive index of the light-transmitting layer 800 may be determined based on the recycling of the light L_R2 that travels from the first wavelength conversion pattern WCL1 back toward the light-emitting diodes ED. The light L_R2 traveling from the first wavelength conversion pattern WCL1 back toward the light-emitting diodes ED passes through the first capping layer CAP1 and the light-transmitting layer 800 and is provided to the electrodes 210 and 220. The refractive index of the first wavelength conversion pattern WCL1 may be, for example, about 1.7 to about 2.0 (the refractive index of the second wavelength conversion pattern WCL2 may be substantially equal to it), and the refractive index of the first capping layer CAP1 may be about 1.6. The refractive index of the light-transmitting layer 800 should be smaller than the refractive index of the first capping layer CAP1 in order to reduce total reflection in case that the lights emitted from the light-emitting diodes ED travel toward the first wavelength conversion pattern WCP1. However, if the refractive index of the light-transmitting layer 800 is too low, the light L_R2 traveling from the first wavelength conversion pattern WCL1 toward the light-emitting diodes ED is totally reflected at the interface between the first capping layer CAP1 and the light-transmitting layer 800 to proceed toward the first wavelength conversion pattern WCP1. As a result, that the effective of the recycling may be lowered. In view of the above, it is desired that the refractive index of the light-transmitting layer 800 may be approximately 1.2 to 1.5.

Figure 7:
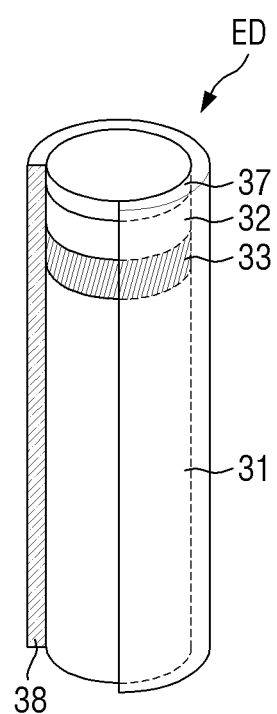
FIG. 7 is a schematic perspective view of a light-emitting element according to an example embodiment of the disclosure.

FIG. 7 is a schematic perspective view of a light-emitting element according to an example embodiment of the disclosure.

Referring to FIG. 7, the light-emitting diode ED is a particle-type element, and may have a rod-like or cylindrical shape having an aspect ratio (e.g., a predetermined or selected aspect ratio). The length of the light-emitting diode ED may be larger than the diameter of the light-emitting diode ED, and the aspect ratio may range from, but is not limited to, about 6:5 to about 100:1.

The light-emitting diodes ED may have a size of a nanometer scale (from about 1 nm to about 1 μm) to a micrometer scale (from about 1 μm to about 1 mm). According to an example embodiment of the disclosure, both of the diameter and length of the light-emitting diode ED may have nanometer scales or micrometer scales. In some other example embodiments, the diameter of the light-emitting diode ED may have a nanometer scale, while the length of the light-emitting diode ED may have a micrometer scale. In some example embodiments, the diameter and/or length of some of the light-emitting elements ED may have nanometer scales, while the diameter and/or length of some others of the light-emitting diodes ED have micrometer scales.

According to an example embodiment of the disclosure, the light-emitting diode ED may be an inorganic light-emitting diode. The inorganic light-emitting diode may include semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light.

According to an example embodiment of the disclosure, the above-described semiconductor layers may be sequentially stacked in a direction which is the longitudinal direction of the light-emitting diode ED. The light-emitting diode ED may include a first semiconductor layer 31, an active layer 33 and a second semiconductor layer 32 sequentially stacked in a direction. The first semiconductor layer 31, the active layer 33 and the second semiconductor layer 32 may be the first conductivity type semiconductor layer, the active semiconductor layer, and the second conductivity type semiconductor layer described above, respectively.

The first semiconductor layer 31 may be doped with a first conductivity type dopant. The first conductivity type dopant may be Si, Ge, Sn, etc., but is not limited thereto. According to an example embodiment of the disclosure, the first semiconductor layer 31 may be n-GaN doped with n-type Si.

The second semiconductor layer 32 may be spaced apart from the first semiconductor layers 31 with the active layer 33 therebetween. The second semiconductor layer 32 may be doped with a second conductivity-type dopant such as Mg, Zn, Ca, Se and Ba. According to an example embodiment of the disclosure, the second semiconductor layer 32 may be p-GaN doped with p-type Mg.

The active layer 33 may include a material having a single or multiple quantum well structure. As described above, the active layer 33 may emit light as electron-hole pairs are combined therein in response to an electrical signal applied through the first semiconductor layer 31 and the second semiconductor layer 32.

In some example embodiments, the active layer 33 may have a structure in which a semiconductor material having a large band gap energy and a semiconductor material having a small band gap energy are alternately stacked on one another, and may include other Group III to Group V semiconductor materials depending on the wavelength range of the emitted light.

The light emitted from the active layer 33 may exit not only through the both end surfaces of the light-emitting diode ED in the longitudinal direction but also through the outer peripheral surface (or outer surface, side surface) of the light-emitting diode ED. For example, the directions in which the light emitted from the active layer 33 propagates are not limited to a direction.

The light-emitting diode ED may further include an element electrode layer 37 disposed on the second semiconductor layer 32. The element electrode layer 37 may be in contact with the second semiconductor layer 32. The element electrode layer 37 may be an ohmic contact electrode but is not limited to it. It may be a schottky contact electrode.

In case that ends (or both ends) of the light-emitting diode ED are electrically connected to the contact electrodes 700 to apply electric signals to the first and second semiconductor layers 31 and 32, the element electrode layer 37 may be disposed between the second semiconductor layer 32 and the electrode to reduce the resistance. The element electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The element electrode layer 37 may include a semiconductor material doped with n-type or p-type impurities.

The light-emitting diode ED may further include an insulating film 38 surrounding the outer peripheral surfaces of the first semiconductor layer 31, the second semiconductor layer 32, the active layer 33 and/or the element electrode layer 37. The insulating film 38 may be disposed to surround at least the outer surface of the active layer 33, and may be extended in a direction in which the light-emitting diode ED is extended. The insulating film 38 can protect the above-described elements. The insulating film 38 may be made of materials having insulating properties and can prevent an electrical short-circuit that may occur in case that the active layer 33 comes in contact with an electrode through which an electric signal is transmitted to the light-emitting diode ED. In addition, since the insulating film 38 includes the active layer 33 to protect the outer peripheral surfaces of the first and second semiconductor layers 31 and 32, it is possible to prevent a decrease in luminous efficiency.

Figure 8:
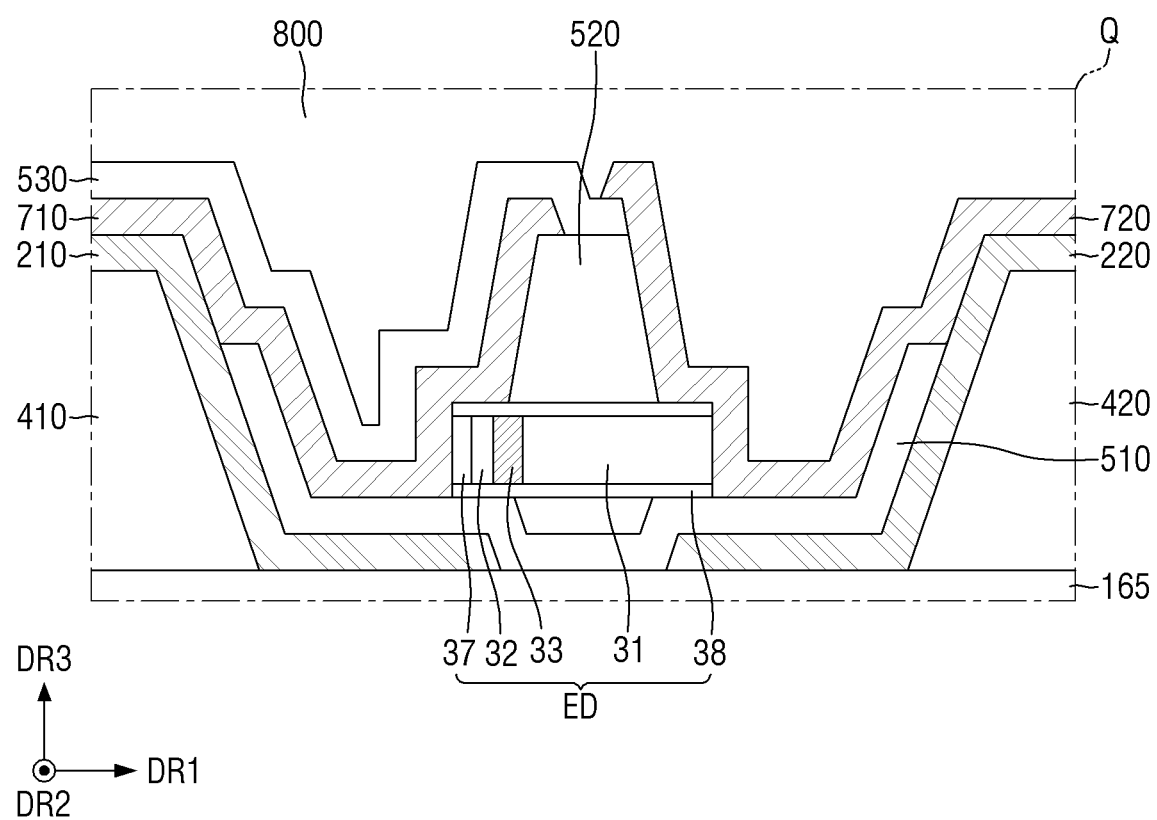
FIG. 8 is a schematic enlarged cross-sectional view showing an example of area Q of FIG. 5.

FIG. 8 is a schematic enlarged cross-sectional view showing an example of area Q of FIG. 5.

Referring to FIGS. 7 and 8, the light-emitting diode ED may be disposed such that the light-emitting diode ED extends parallel to the upper surface of the substrate SUB. The semiconductor layers included in the light-emitting diode ED may be arranged sequentially along the direction parallel to the upper surface of the substrate SUB. For example, the first semiconductor layer 31, the active layer 33 and the second semiconductor layer 32 of the light-emitting diode ED may be arranged sequentially parallel to the upper surface of the substrate SUB.

Specifically, the first semiconductor layer 31, the active layer 33, the second semiconductor layer 32 and the element electrode layer 37 of the light-emitting diode ED may be sequentially formed parallel to the surface of the substrate SUB in the cross section passing through the both ends.

A first end of the light-emitting diode 30 may be located on the first electrode 210, while a second end thereof may be located on the second electrode 220. It should be understood that the disclosure is not limited thereto. The first end of the light-emitting diode ED may be located on the second electrode 220, while the second end thereof may be located on the first electrode 210.

The second insulating layer 520 may be disposed on the light-emitting diode ED. The second insulating layer 520 may be disposed to surround the outer surface of the light-emitting diode ED. The second insulating layer 520 may be disposed to surround the outer surface of the light-emitting diode ED where the light-emitting diode ED is disposed, and may be disposed on the first insulating layer 510 where the light-emitting diode ED is not disposed.

The first contact electrode 710 may be in contact with a first end of the light-emitting diode ED exposed by the second insulating layer 520. Specifically, the first contact electrode 710 may be disposed to surround the outer surface and an end surface of the light-emitting diode ED exposed by the second insulating layer 520. The first contact electrode 710 may be in contact with the insulating film 38 and the element electrode layer 37 of the light-emitting diode ED.

The second contact electrode 720 may be in contact with the second end of the light-emitting diode ED exposed by the second insulating layer 520 and the third insulating layer 530. Specifically, the second contact electrode 720 may be disposed to surround the outer surface and the second end of the light-emitting diode ED exposed by the second insulating layer 520 and the third insulating layer 530. The second contact electrode 720 may be in contact with the insulating film 38 and the first semiconductor layer 31 of the light-emitting diode ED.

Figure 9:
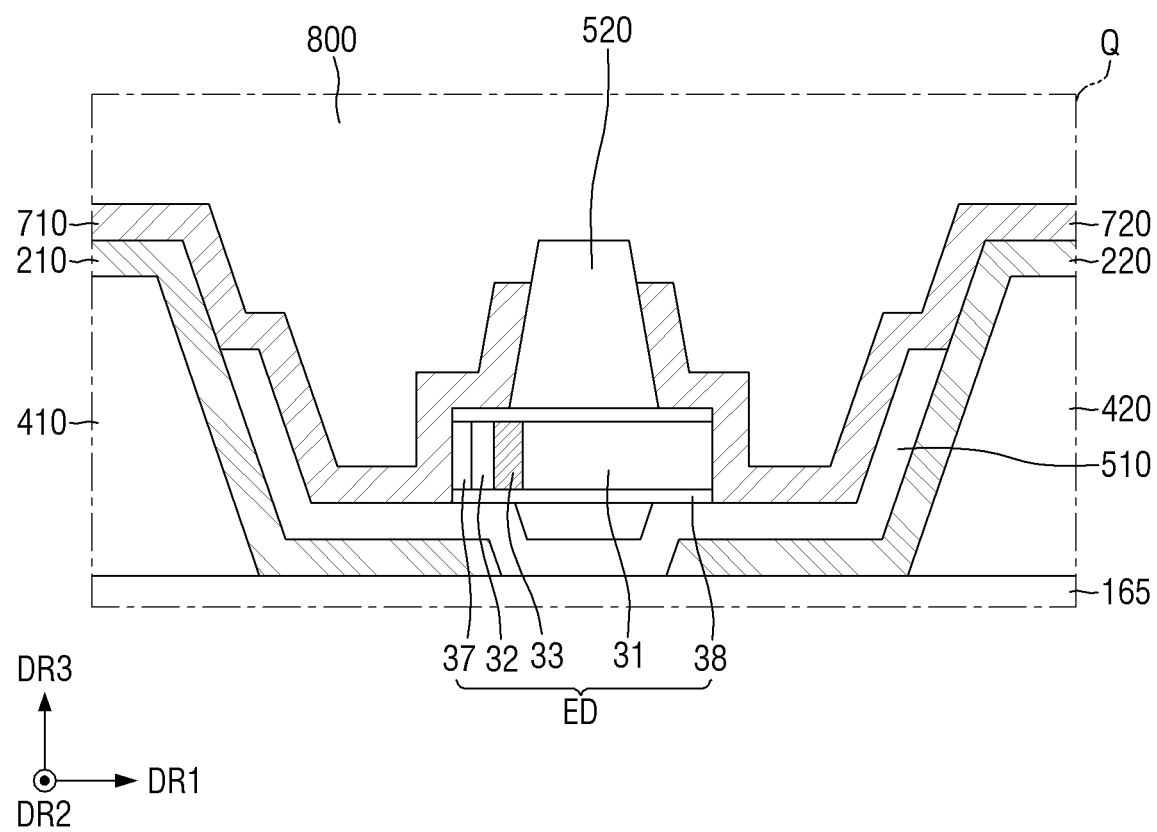
FIG. 9 is a schematic enlarged cross-sectional view showing another example of area Q of FIG. 5.

FIG. 9 is a schematic enlarged cross-sectional view showing another example of area Q of FIG. 5.

The example embodiment of FIG. 9 is different from the example embodiment of FIG. 8 at least in that a first contact electrode 710 and a second contact electrode 720 are formed on the same layer, and the third insulating layer 530 is eliminated from a display device 10.

Specifically, the first and second contact electrodes 710 and 720 may be disposed directly on the second insulating layer 520. The first contact electrode 710 and the second contact electrode 720 may be formed on the same layer. The first contact electrode 710 and the second contact electrode 720 may include the same material. For example, the first contact electrode 710 and the second contact electrode 720 may be formed together via a single mask process. Therefore, no additional mask process is required to form the first and second contact electrodes 710 and 720, and thus the efficiency of the process of fabricating the display device 10 can be improved.

The first contact electrode 710 and the second contact electrode 720 may be spaced apart from each other with the second insulating layer 520 therebetween. The first contact electrode 710 and the second contact electrode 720 may expose at least a part of the upper surface of the second insulating layer 520.

This example embodiment is identical to the example embodiment of FIG. 8 except that the third insulating layer 530 is eliminated; and therefore, repetitive descriptions will be omitted.

Figure 10:
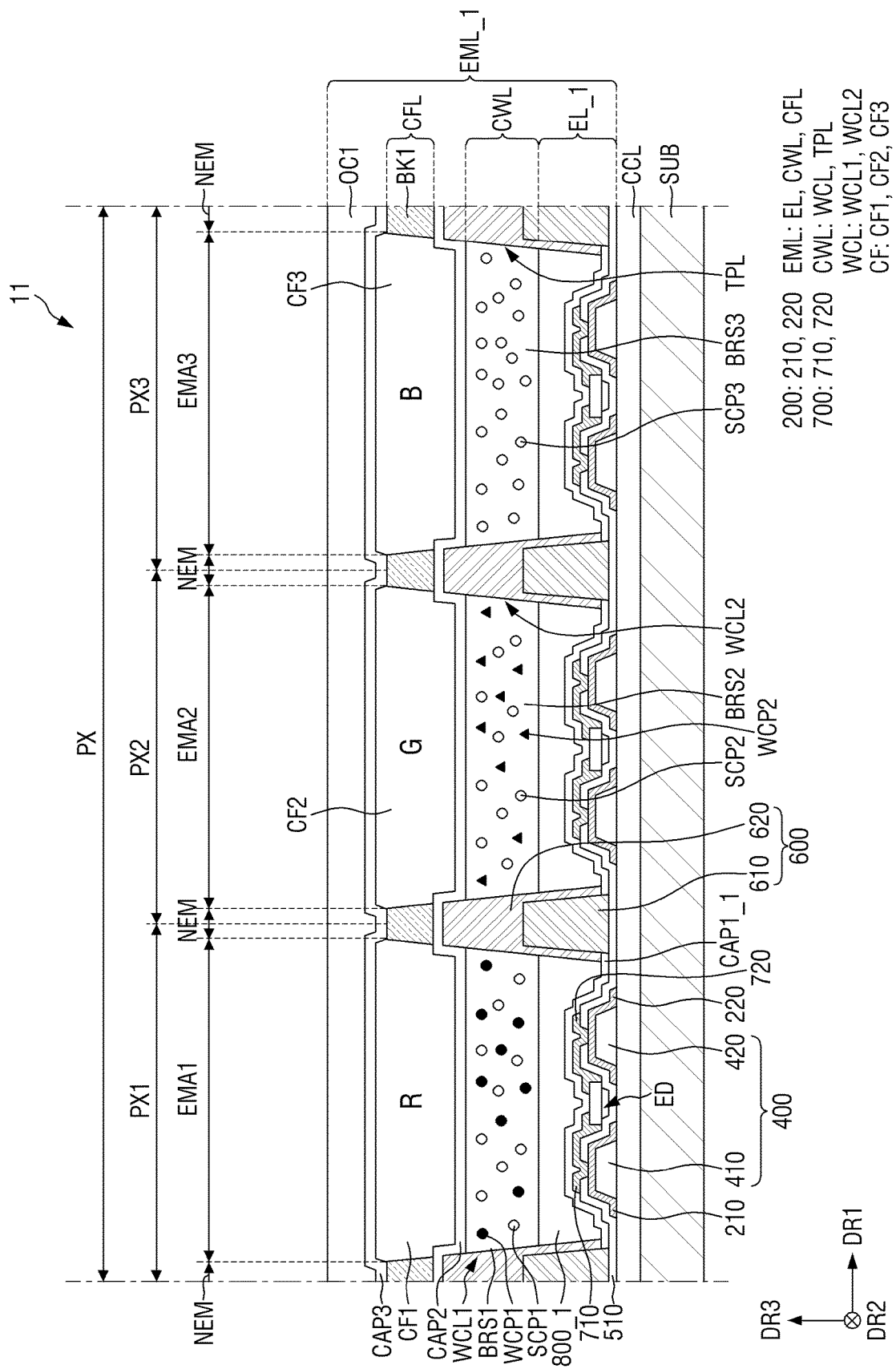
FIG. 10 is a schematic cross-sectional view of a display device according to another example embodiment of the disclosure.
Figure 11:
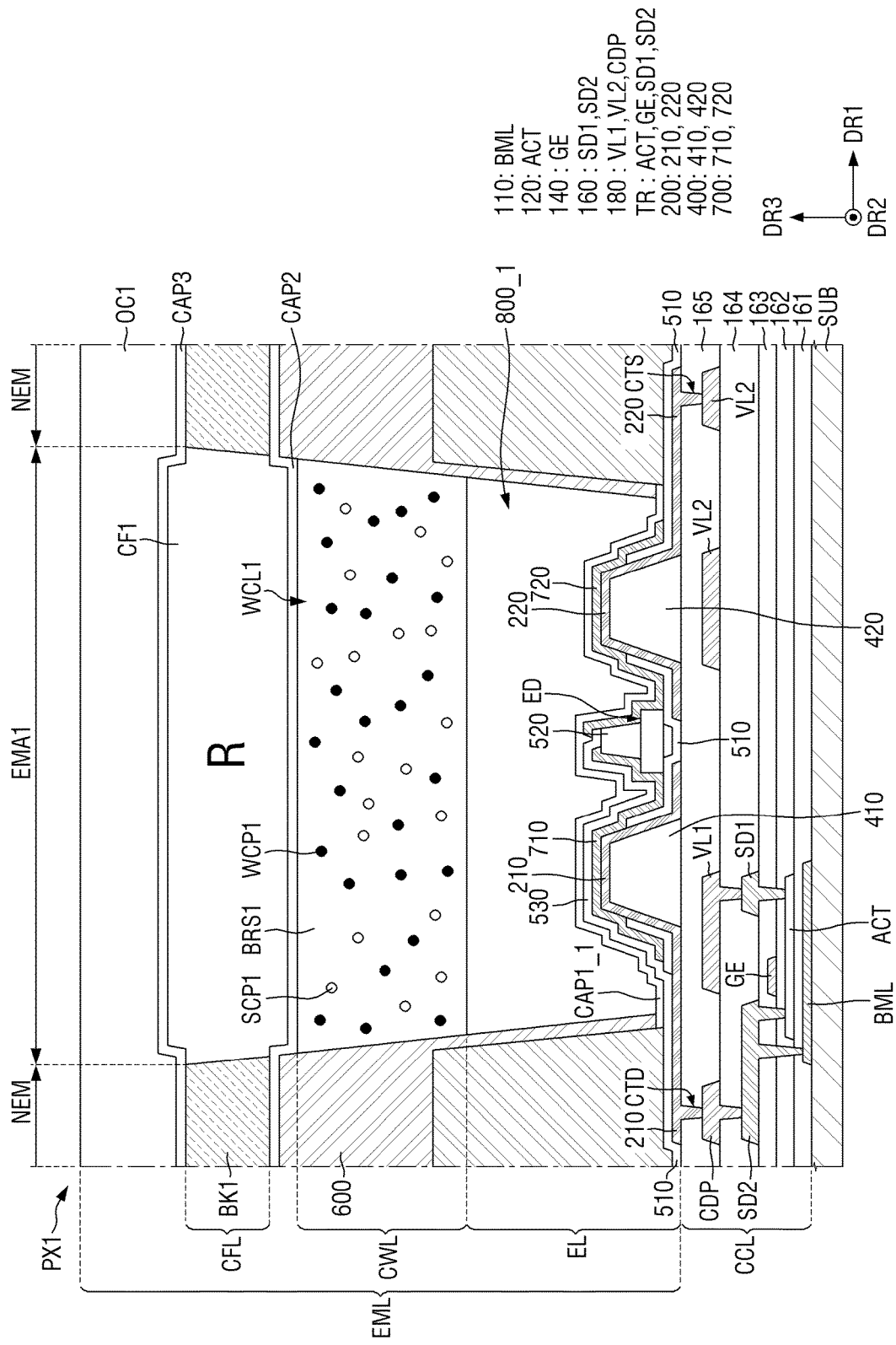
FIG. 11 is a schematic cross-sectional view showing an example of the first emission area of the first sub-pixel included in the display device of FIG. 10.

FIG. 10 is a schematic cross-sectional view of a display device according to another example embodiment of the disclosure. FIG. 11 is a schematic cross-sectional view showing an example of the first emission area of the first sub-pixel included in the display device of FIG. 10.

A display device 11 according to the example embodiment of FIGS. 10 and 11 is different from the display device 10 according to the example embodiment of FIGS. 3 and 5 in that a first capping layer CAP1_1 is disposed on a lower bank 610, a first insulating layer 510 and contact electrodes 710 and 720, and is disposed on the lower surface of a light-transmitting layer 800_1 and on the lower surface of an upper bank 620.

More specifically, the first capping layer CAP1_1 may be in direct contact with the first insulating layer 510. The first capping layer CAP1_1 may be in direct contact with a part of the lower end of the side surface of the lower bank 610, and may expose another part of the lower end and the upper end of the side surface of the lower bank 610. The another part of the lower end and the upper end of the lower bank 610 exposed by the first capping layer CAP1_1 may be in direct contact with the above-described upper bank 620.

The light-transmitting layer 800_1 may be disposed on (or adjacent to or abutting) the upper bank 620. The light-transmitting layer 800_1 may be in direct contact with the side surface of the upper bank 620.

For example, the stacking order of a display layer EML_1 and a light-emitting element layer EL_1 of the display device 11 according to this example embodiment is different from the stacking order of the display layer EML and the light-emitting element layer EL of the display device 10 of FIG. 3. The other elements of the display layer EML_1 are identical to those of the display layer EML described above; and, therefore, repetitive descriptions will be omitted.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a plurality of pixels;
   a first electrode and a second electrode disposed in each of the plurality of pixels and spaced apart from each other on a substrate;
   a plurality of light-emitting elements disposed between the first electrode and the second electrode;
   a wavelength control layer disposed on the plurality of light-emitting elements;
   a light-transmitting layer disposed between the plurality of light-emitting elements and the wavelength control layer; and
   a bank disposed along a boundary of each of the plurality of pixels on the substrate and extending higher than the light-transmitting layer in a direction perpendicular to the substrate,
   wherein the light-transmitting layer disposed in each of the plurality of pixels is completely separated from the light-transmitting layer disposed in an adjacent one of the plurality of pixels by the bank-,
   wherein the bank includes a lower bank and an upper bank disposed on and overlapping the lower bank in a plan view, and
   a size of the upper bank is greater than a size of the lower bank in a plan view.

2. The display device of claim 1, wherein
   the bank exposes a part of each of the first electrode and the second electrode, and
   the plurality of light-emitting elements are disposed between the first electrode and the second electrode exposed by the bank.

3. The display device of claim 2, wherein at least a part of a space defined by the bank is filled with the light-transmitting layer.

4. The display device of claim 3, wherein the wavelength control layer is disposed in the space defined by the bank.

5. The display device of claim 2, wherein
   the light-transmitting layer overlaps the plurality of light-emitting elements and the wavelength control layer in a plan view, and
   the light-transmitting layer contacts a side surface of the bank.

6. The display device of claim 2, wherein
   the light-transmitting layer is disposed in a space defined by the lower bank, and
   the wavelength control layer is disposed in a space defined by the upper bank.

7. The display device of claim 6, wherein the light-transmitting layer is disposed between the lower bank and the upper bank in a plan view.

8. The display device of claim 6, wherein the light-transmitting layer is disposed between the plurality of light-emitting elements and the wavelength control layer.

9. The display device of claim 1, wherein
   the plurality of pixels comprises:
      a first pixel displaying a first color; and
      a second pixel displaying a second color, and
   the wavelength control layer comprises:
      a first wavelength conversion pattern disposed in the first pixel and converting light of a third color into light of the first color; and
      a second wavelength conversion pattern disposed in the second pixel and converting the light of the third color into the light of the second color.

10. The display device of claim 1, further comprising:
    contact electrodes disposed on the plurality of light-emitting elements,
    wherein the contact electrodes comprise:
       a first contact electrode electrically connecting the first electrode with first ends of the plurality of light-emitting elements; and
       a second contact electrode electrically connecting the second electrode with second ends of the plurality of light-emitting elements.

11. The display device of claim 10, wherein the light-transmitting layer is disposed on the contact electrodes.

12. The display device of claim 1, further comprising:
    a first capping layer disposed between the wavelength control layer and the light-transmitting layer.

13. The display device of claim 12, further comprising:
    a second capping layer disposed on the wavelength control layer.

14. A display device comprising:
    a plurality of pixels;
    a first electrode and a second electrode disposed in each of the plurality of pixels and spaced apart from each other on a substrate;
    a plurality of light-emitting elements disposed between the first electrode and the second electrode;
    a wavelength control layer disposed on the plurality of light-emitting elements;
    a light-transmitting layer disposed between the plurality of light-emitting elements and the wavelength control layer; and
    a bank disposed along a boundary of each of the plurality of pixels on the substrate and extending higher than the light-transmitting layer in a direction perpendicular to the substrate,
    wherein
       the plurality of pixels comprises:
          a first pixel displaying a first color; and
          a second pixel displaying a second color,
       the wavelength control layer comprises:
          a first wavelength conversion pattern that is disposed in the first pixel and converts light of a third color into light of the first color; and
          a second wavelength conversion pattern that is disposed in the second pixel and converts the light of the third color into light of the second color, and
       a refractive index of the light-transmitting layer is smaller than a refractive index of each of the first wavelength conversion pattern and the second wavelength conversion pattern, and
       the light-transmitting layer disposed in each of the plurality of pixels is completely separated from the light-transmitting layer disposed in an adjacent one of the plurality of pixels by the bank, wherein the bank includes a lower bank and an upper bank disposed on and overlapping the lower bank in a plan view, and a size of the upper bank is greater than a size of the lower bank in a plan view.

15. The display device of claim 14, wherein the refractive index of the light-transmitting layer is in a range of about 1.2 to about 1.5.

16. The display device of claim 14, wherein the bank exposes a part of each of the first electrode and the second electrode, the plurality of light-emitting elements are disposed between the first electrode and the second electrode exposed by the bank, and a space defined by the bank is at least partially filled with the light-transmitting layer.

17. The display device of claim 16, wherein the light-transmitting layer is disposed in a space defined by the lower bank, and the wavelength control layer is disposed in a space defined by the upper bank.

18. The display device of claim 17, wherein the light-transmitting layer is disposed between the lower bank and the upper bank in a plan view.

19. The display device of claim 17, wherein the light-transmitting layer is disposed between the plurality of light-emitting elements and the wavelength control layer.

* * * * *